United States Patent
Kawai et al.

(10) Patent No.: US 8,219,043 B2
(45) Date of Patent: Jul. 10, 2012

(54) RADIO TRANSMISSION APPARATUS AND RADIO TRANSMISSION METHOD

(75) Inventors: Takatoshi Kawai, Shizuoka (JP); Kaoru Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 374 days.

(21) Appl. No.: 12/644,546

(22) Filed: Dec. 22, 2009

(65) Prior Publication Data

US 2010/0167798 A1   Jul. 1, 2010

(30) Foreign Application Priority Data

Dec. 26, 2008   (JP) ................................. 2008-334781

(51) Int. Cl.
*H04B 1/00*   (2006.01)

(52) U.S. Cl. ................. 455/114.3; 455/63.1; 455/127.1; 455/127.3

(58) Field of Classification Search ................. 455/63.1, 455/91, 114.3, 127.1, 127.3
See application file for complete search history.

(56) References Cited

U.S. PATENT DOCUMENTS

| | | | | |
|---|---|---|---|---|
| 6,822,517 B2* | 11/2004 | Matsumoto et al. | .......... | 330/295 |
| 7,884,681 B1* | 2/2011 | Khlat et al. | .................... | 332/149 |
| 2006/0262889 A1* | 11/2006 | Kalvaitis et al. | ............... | 375/355 |

FOREIGN PATENT DOCUMENTS

JP   2005-518745   6/2005

* cited by examiner

*Primary Examiner* — Tuan Pham
(74) *Attorney, Agent, or Firm* — Wenderoth, Lind & Ponack, L.L.P.

(57) ABSTRACT

A radio transmission apparatus according to the present invention detects an output current of a power supply section that varies in response to a variation of the output impedance of an amplification section, and corrects a distortion of the input/output characteristic of the amplification section by using an LUT corresponding to the detected output current. In addition, a threshold used for switching an LUT is caused to be different depending on a switching direction between LUTs, thereby suppressing frequent occurrence of switching of the LUT.

6 Claims, 21 Drawing Sheets

F I G. 2
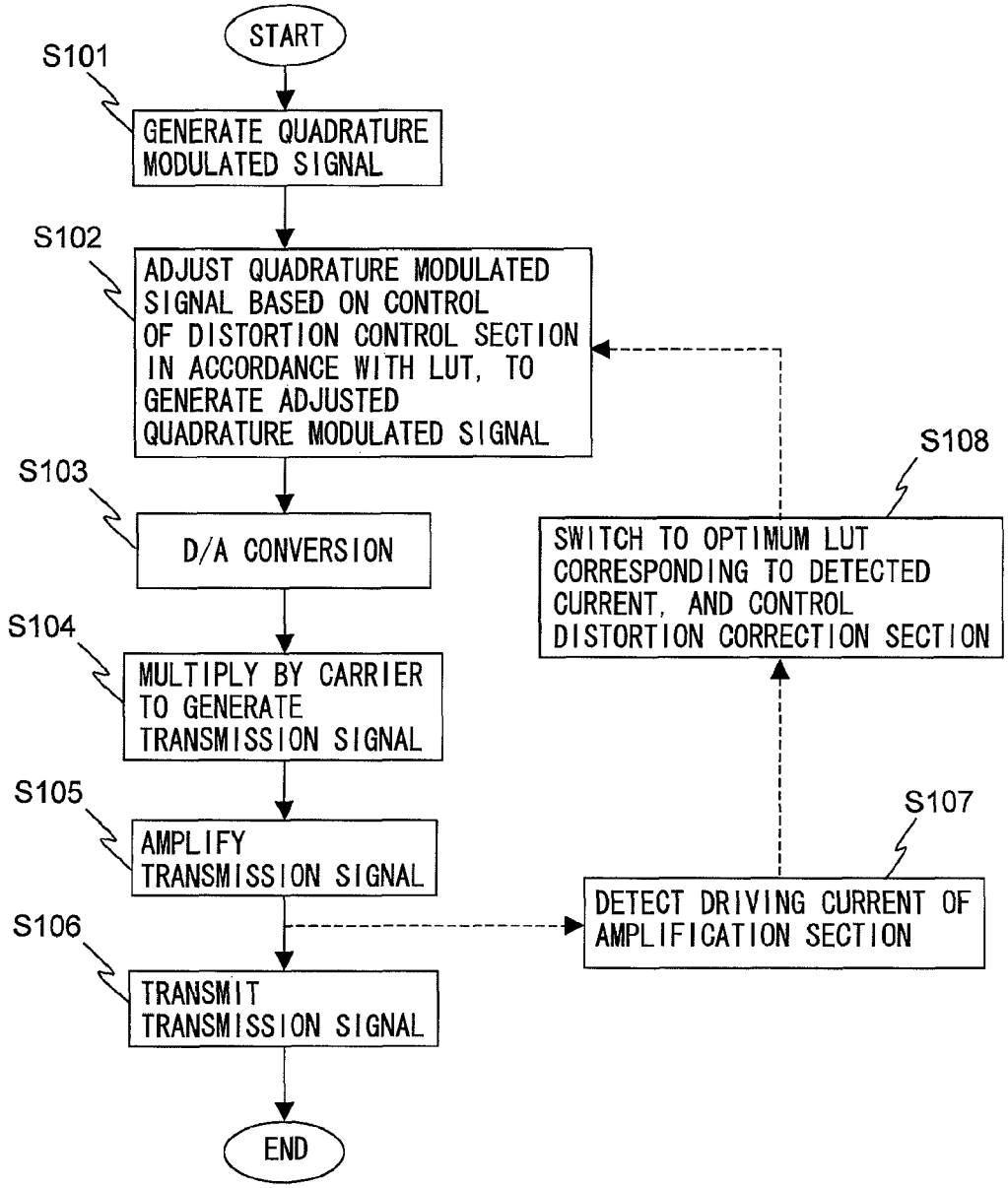

FIG. 3
INPUT/OUTPUT CHARACTERISTIC OF
AMPLIFICATION SECTION 107
(a)
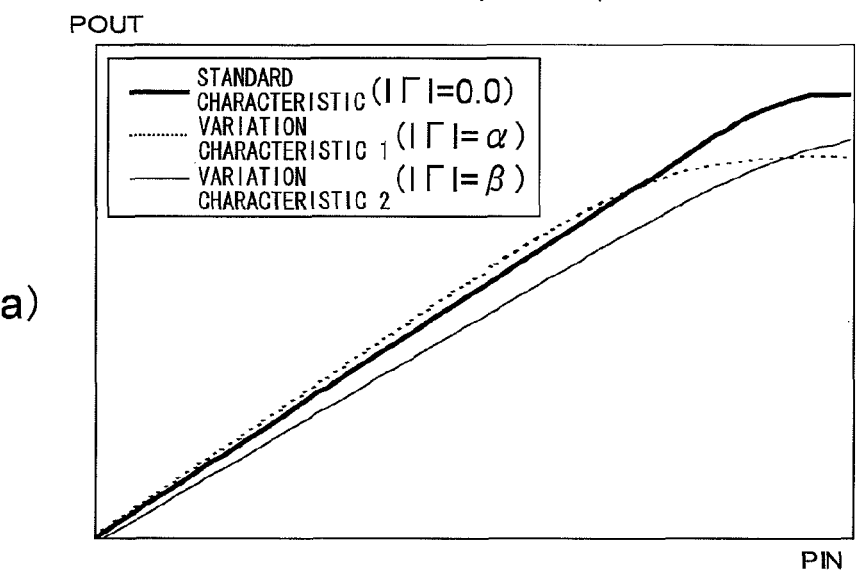
(b)
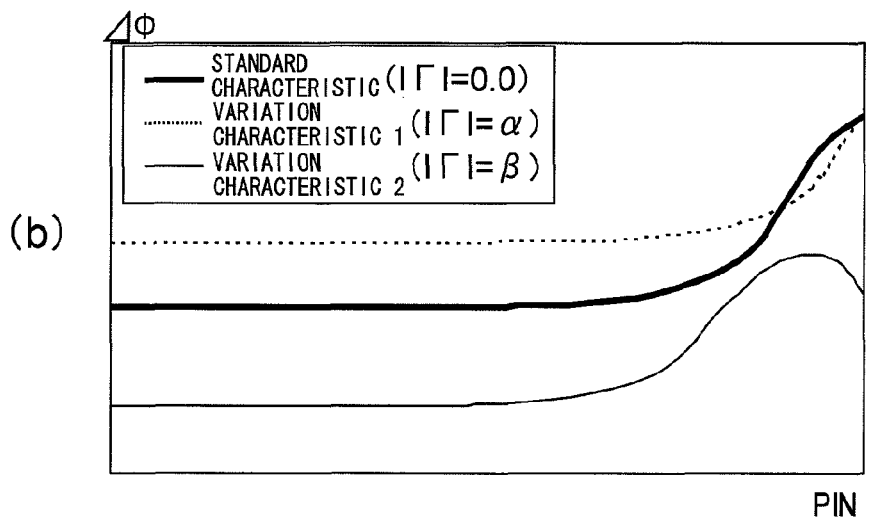

FIG. 6
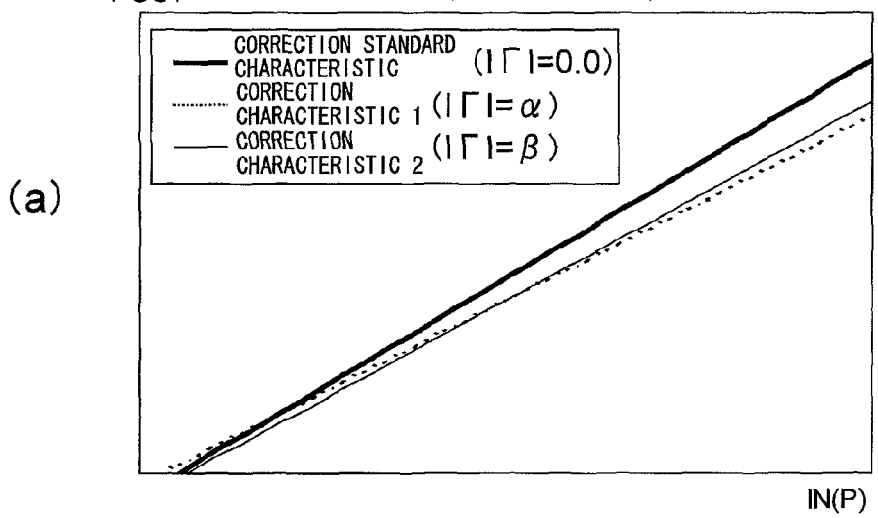
(a) INPUT/OUTPUT CHARACTERISTIC OF RADIO TRANSMISSION APPARATUS 100
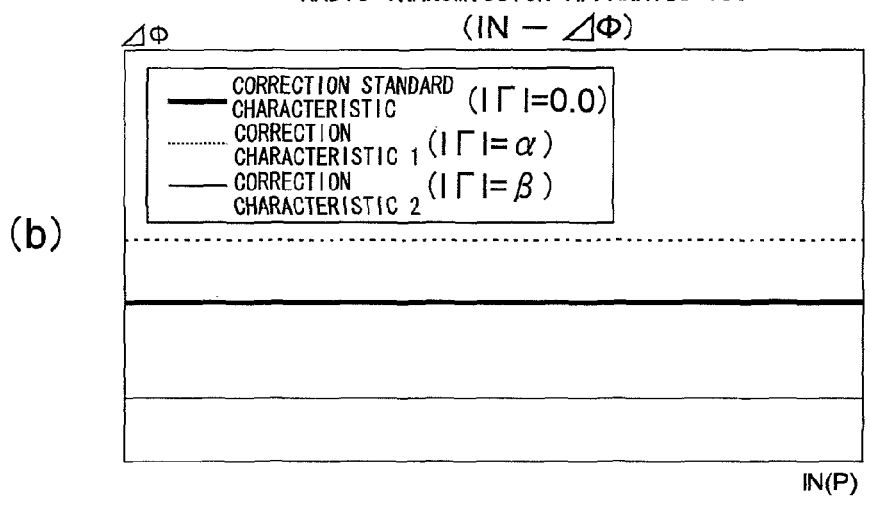
(b)

FIG. 9
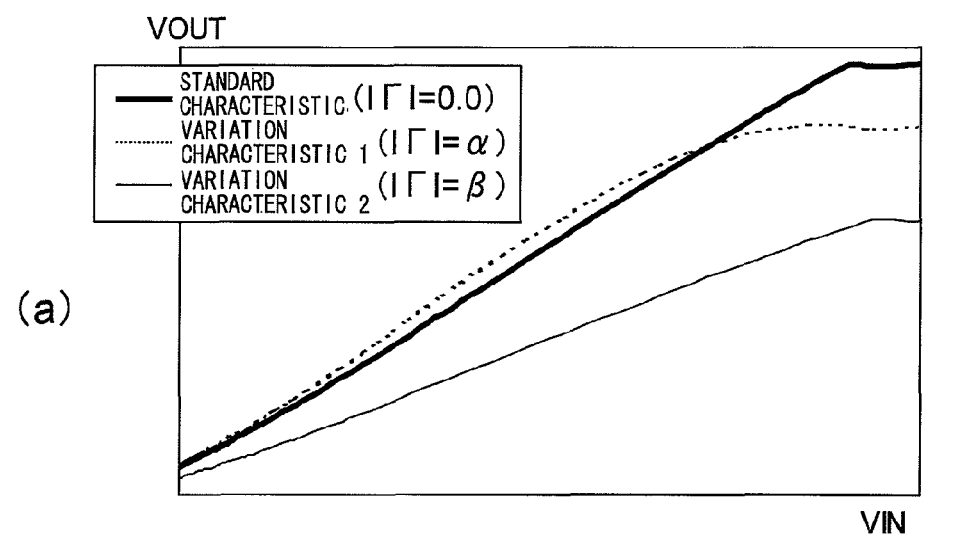
(a)
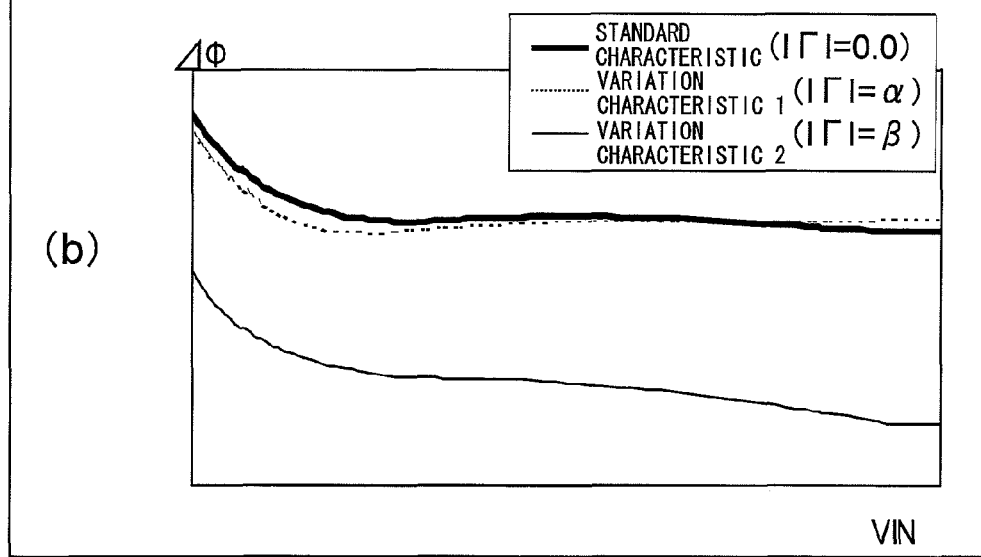
(b)

FIG. 10
LUT
(a) AMPLITUDE SIGNAL DISTORTION CORRECTION SECTION CHARACTERISTIC IN− OUT/IN
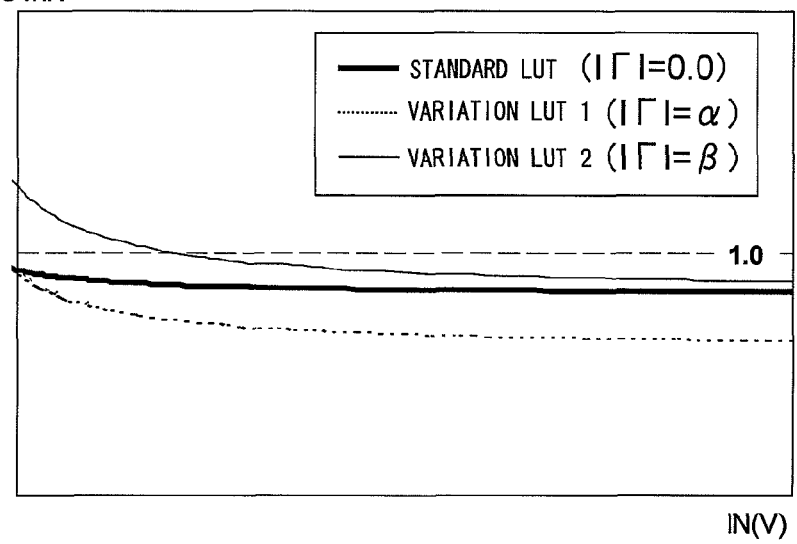
(b) PHASE SIGNAL DISTORTION CORRECTION SECTION CHARACTERISTIC VIN − $\Delta$phase
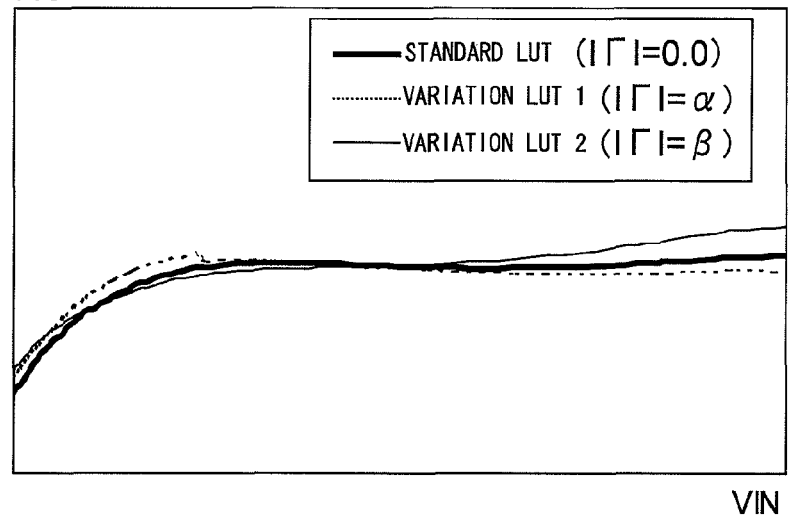

F I G. 1 4 PRIOR ART

FIG. 16 PRIOR ART
LUT
(a) INPUT-GAIN CHARACTERISTIC OF DISTORTION CORRECTION SECTION
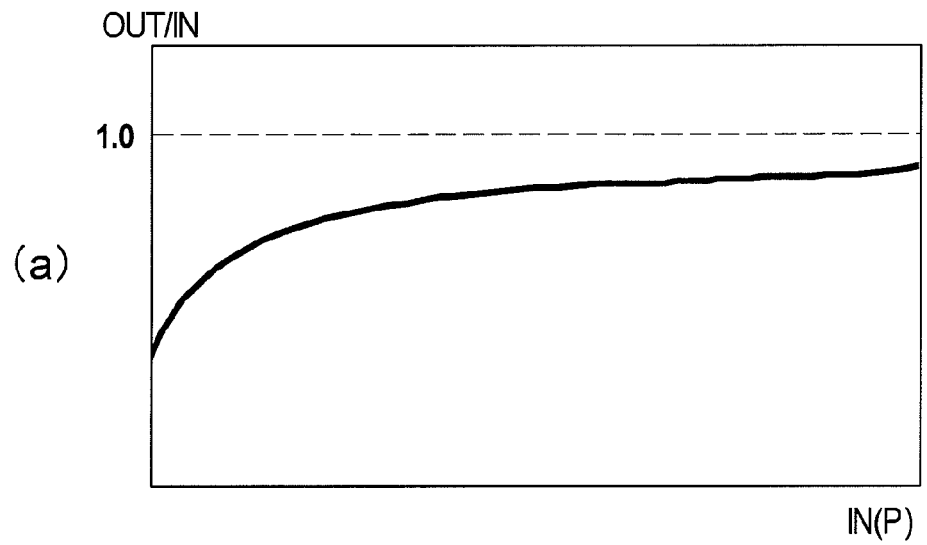
(b) INPUT-INPUT/OUTPUT PHASE DIFFERENCE OF DISTORTION CORRECTION SECTION
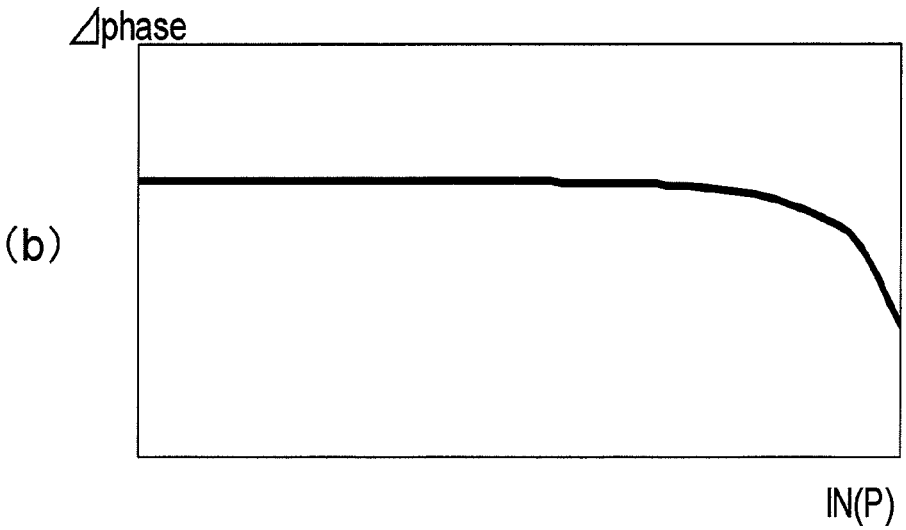

F I G. 1 8 PRIOR ART

FIG. 20 PRIOR ART
LUT
AMPLITUDE SIGNAL DISTORTION
CORRECTION SECTION CHARACTERISTIC IN— OUT/IN
(a)
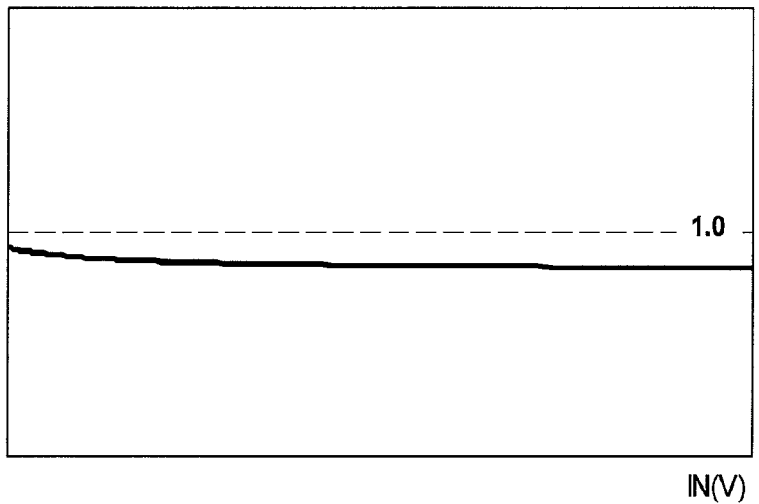
PHASE SIGNAL DISTORTION
CORRECTION SECTION CHARACTERISTIC VIN — $\Delta$phase
(b)
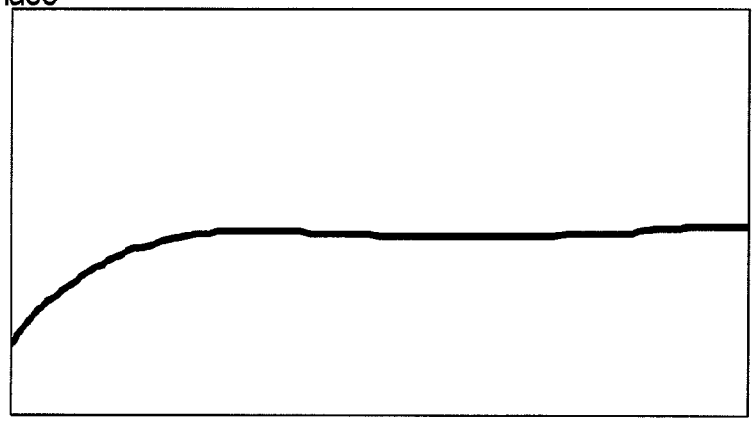

FIG. 21 PRIOR ART
INPUT/OUTPUT CHARACTERISTIC OF
RADIO TRANSMISSION APPARATUS 600
(a) AM PATH IN − VOUT
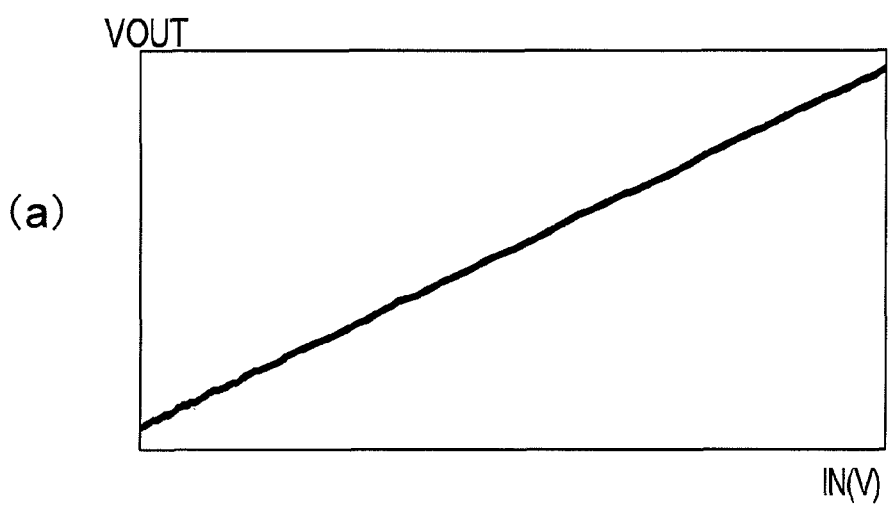
(b) PM PATH VIN − ΔΦ
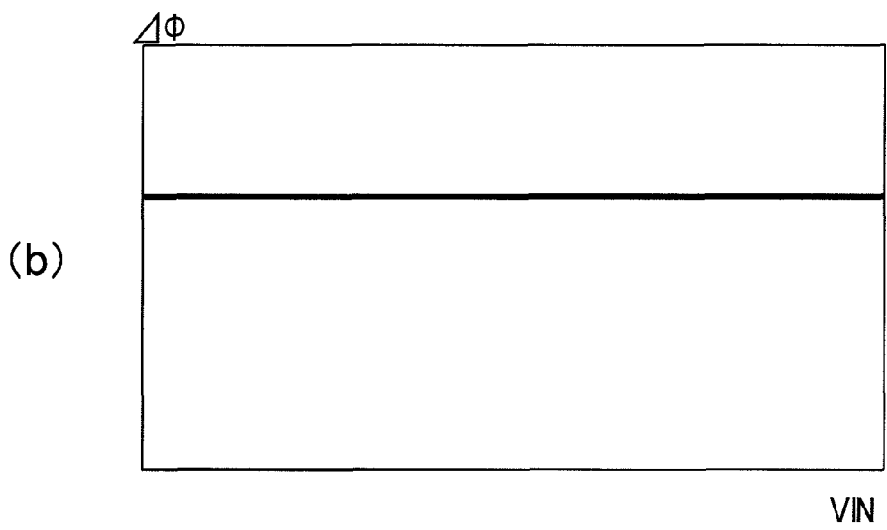

RADIO TRANSMISSION APPARATUS AND RADIO TRANSMISSION METHOD

BACKGROUND OF THE INVENTION

1. Field of the Invention

The present invention relates to a radio transmission apparatus and a radio transmission method, and more particularly, to a radio transmission apparatus and a radio transmission method that use a quadrature modulation scheme or the like.

2. Description of the Background Art

In a mobile terminal such as a mobile phone, when there is a conductor, such as a metal or a human body, near an antenna, the characteristic of the antenna is disturbed. Thus, the output impedance of an amplifier of the mobile terminal is shifted from a desired value, and a reflected wave of a transmission signal outputted by the amplifier returns from the antenna to the amplifier. As a result, the input/output characteristic of the amplifier varies. Thus, the mobile terminal does not meet standards concerning distortion such as ACP (Adjacent Channel leakage Power). This results in a cause of communication failure such as outputting of a wave over a channel other than a specified communication channel.

In order to prevent such a problem, conventionally, an isolator is inserted between the amplifier and the antenna such that the reflected wave, which returns from the antenna because the output impedance of the amplifier is shifted from the desired value, does not reach the amplifier, thereby preventing the variation of the input/output characteristic of the amplifier.

FIG. 14 is a view showing an example of a conventional radio transmission apparatus 500 that modulates data using a quadrature modulation scheme and transmits the modulated data. The conventional radio transmission apparatus 500 will be described below with reference to FIG. 14. The radio transmission apparatus 500 includes a modulation section 501, a distortion correction section 502, a look-up table holding section (hereinafter, referred to as an LUT holding section) 503, a distortion control section 504, a digital/analogue conversion section (hereinafter, referred to as a D/A) 505, a mixer 506, an amplification section 507, a power supply section 508, an isolator 509, and an antenna 510.

The modulation section 501 generates a quadrature modulated signal using an I-phase signal and a Q-phase signal that are signals for modulation.

The LUT holding section 503 holds a look-up table (hereinafter, referred to an LUT) for correcting a distortion of an output signal of the amplification section 507.

Here, the input/output characteristic of the amplification section 507 will be described prior to description of an LUT of the LUT holding section 503. FIG. 15 shows the input/output characteristic of the amplification section 507. In FIG. 15(a), the horizontal axis indicates an electric power PIN of an input signal of the amplification section 507, and the vertical axis indicates an electric power POUT of an output signal of the amplification section 507. As shown in FIG. 15(a), due to the influence of a saturation region, the electric power input/output characteristic of the amplification section 507 becomes nonlinear. In FIG. 15(b), the horizontal axis indicates the electric power PIN of the input signal of the amplification section 507, and the vertical axis indicates a shift ΔΦ between the phases of the input and output signals of the amplification section 507. As shown in FIG. 15(b), due to the influence of a saturation region, the shift ΔΦ between the phases of the input and output signals of the amplification section 507 varies and does not become constant. In other words, the input/output characteristic of the amplification section 507 is distorted in terms of electric power and phase.

FIG. 16 represents the LUT, held by the LUT holding section 503, by using two graphs for convenience of explanation. The graph of FIG. 16(a) is used for adjusting the electric power PIN of the input signal of the amplification section 507. In the graph of FIG. 16(a), the horizontal axis indicates an electric power IN of an input signal of the distortion correction section 502, and the vertical axis indicates a gain (OUT/IN) given to the electric power IN of this input signal by the distortion correction section 502. The graph of FIG. 16(b) is used for adjusting the phase of the input signal of the amplification section 507. In the graph of FIG. 16(b), the horizontal axis indicates the electric power IN of the input signal of the distortion correction section 502, and the vertical axis indicates a phase variation Δphase given to this input signal by the distortion correction section 502.

The distortion control section 504 refers to the LUT of the LUT holding section 503 and controls the distortion correction section 502, thereby causing the distortion correction section 502 to adjust the electric power and the phase of the quadrature modulated signal generated by the modulation section 501.

In accordance with the control of the distortion control section 504, the distortion correction section 502 adjusts the electric power and the phase of the quadrature modulated signal generated by the modulation section 501, and outputs the adjusted quadrature modulated signal. Specifically, the distortion correction section 502 gives the quadrature modulated signal a gain in accordance with its electric power IN (see FIG. 16(a)), and also gives the quadrature modulated signal a phase variation Δphase in accordance with its electric power IN (see FIG. 16(b)), to generate the adjusted quadrature modulated signal.

The D/A 505 converts the adjusted quadrature modulated signal from digital form into analogue form.

The mixer 506 multiplies the adjusted quadrature modulated signal outputted by the D/A 505, by a local oscillation signal Lo that is a carrier, to generate a transmission signal. It is noted that a local oscillator that generates the local oscillation signal Lo is not shown in FIG. 14.

The power supply section 508 supplies a driving electric power to the amplification section 507.

The amplification section 507 amplifies the transmission signal by using the electric power supplied from the power supply section 508. FIG. 17 is a graph showing the relation between the quadrature modulated signal inputted to the distortion correction section 502 and the output signal of the amplification section 507. As shown in FIG. 17(a), the electric power IN of the quadrature modulated signal inputted to the distortion correction section 502 and the electric power POUT of the output signal of the amplification section 507 are corrected so as to have a linear relation therebetween by the aforementioned process of the distortion correction section 502. In addition, as shown in FIG. 17(b), a shift ΔΦ between the phase of the quadrature modulated signal inputted to the distortion correction section 502 and the phase of the output signal of the amplification section 507 is corrected so as to be constant by the aforementioned process of the distortion correction section 502. In other words, the transmission signal inputted to the amplification section 507 is adjusted based on the LUT of FIG. 16, thereby correcting a distortion of the transmission signal as a whole in the radio transmission apparatus 500 (see FIGS. 15 to 17).

The transmission signal amplified by the amplification section 507 is sent to the antenna 510 through the isolator 509.

The antenna 510 transmits the transmission signal amplified by the amplification section 507, to the exterior space.

The isolator 509 suppresses a variation of the output impedance of the amplification section 507, and blocks a reflected wave that returns from the antenna 510 thereto, such that the reflected wave does not reach the amplification section 507.

As described above, in the conventional radio transmission apparatus 500, the isolator 509 that is inserted between the amplification section 507 and the antenna 510 suppresses the variation of the output impedance of the amplification section 507 such that the reflected wave, which returns from the antenna 510, does not reach the amplification section 507. By so doing, as shown in FIG. 15, the input/output characteristic of the amplification section 507 does not vary. As a result, the conventional radio transmission apparatus 500 can maintain the desired input/output characteristic shown in FIG. 17, and hence can meet the standards concerning distortion such as ACP.

FIG. 18 is a view showing an example of a conventional radio transmission apparatus 600 that modulates data using a polar modulation scheme and transmits the modulated data. The conventional radio transmission apparatus 600 will be described below with reference to FIG. 18. The radio transmission apparatus 600 includes an amplitude/phase extraction section 601, an amplitude signal distortion correction section 602, a phase signal distortion correction section 603, a D/A 604, a D/A 605, a distortion control section 606, an LUT holding section 607, a mixer 608, an amplitude signal amplification section 609, a DC power supply section 610, an amplification section 611, an isolator 612, and an antenna 613.

The amplitude/phase extraction section 601 extracts an amplitude component of a signal for modulation to generate an amplitude signal, and extracts a phase component of the signal for modulation to generate a phase signal.

The LUT holding section 607 holds an LUT for correcting a distortion of an output signal of the amplification section 611.

Here, the input/output characteristic of the amplification section 611 will be described prior to description of the LUT of the LUT holding section 607. FIG. 19 shows the input/output characteristic of the amplification section 611. In FIG. 19(a), the horizontal axis indicates a driving voltage VIN supplied to the amplification section 611, and the vertical axis indicates a voltage VOUT of the output signal of the amplification section 611. As shown in FIG. 19(a), due to the influence of a saturation region, the relation between the driving voltage VIN (amplitude signal voltage) supplied to the amplification section 611 and the voltage VOUT of the output signal (polar modulated signal) of the amplification section 611 becomes nonlinear. In FIG. 19(b), the horizontal axis indicates the driving voltage VIN (amplitude signal voltage) supplied to the amplification section 611, and the vertical axis indicates a shift ΔΦ between the phase of the phase signal inputted to the amplification section 611 and the phase of the output signal (polar modulated signal) of the amplification section 611. As shown in FIG. 19(b), due to the influence of a saturation region, the shift ΔΦ between the phase of the phase signal inputted to the amplification section 611 and the phase of the output signal of the amplification section 611 varies and does not become constant.

FIG. 20 represents the LUT, held by the LUT holding section 607, by using two graphs for convenience of explanation. The graph of FIG. 20(a) is used for adjusting the driving voltage VIN (amplitude signal voltage) supplied to the amplification section 611. In the graph of FIG. 20(a), the horizontal axis indicates a voltage IN of an input signal of the amplitude signal distortion correction section 602, and the vertical axis indicates a gain (OUT/IN) given to the voltage IN of the input signal by the amplitude signal distortion correction section 602. The graph of FIG. 20(b) is used for adjusting the phase of the phase signal inputted to the amplification section 611. In the graph of FIG. 20(b), the horizontal axis indicates the driving voltage VIN supplied to the amplification section 611, and the vertical axis indicates a phase variation Δphase given by the phase signal distortion correction section 603 to the phase signal inputted to the phase signal distortion correction section 603.

The distortion control section 606 refers to the LUT of the LUT holding section 607 and controls the amplitude signal distortion correction section 602 and the phase signal distortion correction section 603, thereby causing: the amplitude signal distortion correction section 602 to adjust the amplitude signal generated by the amplitude/phase extraction section 601; and the phase signal distortion correction section 603 to adjust the phase signal generated by the amplitude/phase extraction section 601.

In accordance with the control of the distortion control section 606, the amplitude signal distortion correction section 602 adjusts the voltage (amplitude) of the amplitude signal generated by the amplitude/phase extraction section 601, and outputs the adjusted amplitude signal. Specifically, the amplitude signal distortion correction section 602 gives the amplitude signal a gain in accordance with its voltage (see FIG. 20(a)), to generate the adjusted amplitude signal.

In accordance with the control of the distortion control section 606, the phase signal distortion correction section 603 adjusts the phase of the phase signal generated by the amplitude/phase extraction section 601, and outputs the adjusted phase signal. Specifically, the phase signal distortion correction section 603 gives the phase signal a phase variation Δphase in accordance with the driving voltage VIN supplied to the amplification section 611 (see FIG. 20(b)), to generate the adjusted phase signal.

The D/A 604 converts the adjusted amplitude signal generated by the amplitude/phase extraction section 601, from digital form into analogue form.

The D/A 605 converts the adjusted phase signal generated by the amplitude/phase extraction section 601, from digital form into analogue form.

The mixer 608 generates a signal that is obtained by multiplying the adjusted phase signal outputted by the D/A 605, by a local oscillation signal Lo that is a carrier. It is noted that a local oscillator that generates the local oscillation signal Lo is not shown in FIG. 18.

The amplitude signal amplification section 609 amplifies the adjusted amplitude signal outputted from the D/A 604, by using the electric power of the DC power supply section 610, to generate the driving voltage VIN that is to be supplied to the amplification section 611.

The amplification section 611 amplifies the output signal (PM signal) of the mixer 608 by using the driving voltage VIN (AM signal) supplied from the amplitude signal amplification section 609, to generate the polar modulated signal.

FIG. 21 is graphs respectively showing the relation between the amplitude signal inputted to the amplitude signal distortion correction section 602 and the output signal (polar modulated signal) of the amplification section 611 and the relation between the phase of the phase signal inputted to the phase signal distortion correction section 603 and the phase of the output signal (polar modulated signal) of the amplification section 611. As shown in FIG. 21(a), the voltage IN of the amplitude signal inputted to the amplitude signal distortion correction section 602 and the voltage VOUT of the output signal of the amplification section 611 are corrected so as to have a linear relation therebetween by the aforementioned process of the amplitude signal distortion correction section 602. In addition, as shown in FIG. 21(b), the shift $\Delta\Phi$ between the phase of the phase signal inputted to the phase signal distortion correction section 603 and the phase of the output signal of the amplification section 611 are corrected so as to be constant by the aforementioned process of the phase signal distortion correction section 603. In other words, the phase signal inputted to the amplification section 611 and the amplitude signal supplied as the driving voltage VIN to the amplification section 611 are adjusted by using the LUT of FIG. 20, thereby correcting a distortion of the polar modulated signal as a whole in the radio transmission apparatus 600 (see FIGS. 19 to 21).

The polar modulated signal generated by the amplification section 611 is sent to the antenna 613 through the isolator 612.

The antenna 613 transmits the polar modulated signal generated by the amplification section 611, to the exterior space.

The isolator 612 suppresses a variation of the output impedance of the amplification section 611, and blocks a reflected wave that returns from the antenna 613 thereto, such that the reflected wave does not reach the amplification section 611.

As described above, in the conventional radio transmission apparatus 600, the isolator 612 that is inserted between the amplification section 611 and the antenna 613 suppresses the variation of the output impedance of the amplification section 611 such that the reflected wave, which returns from the antenna 613, does not reach the amplification section 611. By so doing, the input/output characteristic of the amplification section 611 (see FIG. 19) does not vary. As a result, the conventional radio transmission apparatus 600 can maintain the desired input/output characteristic shown in FIG. 21, and hence can meet the standards concerning distortion such as ACP. The technology for suppressing a variation of the output impedance of an amplification section using an isolator as in the aforementioned conventional radio transmission apparatus 600 is described in paragraphs [0002] to [0005], [0016] and the like of Japanese Laid-Open Patent Publication (translation of PCT application) No. 2005-518745.

However, an isolator requires a large area to be mounted, and needs to have a certain height due to use of a magnet. In addition, the isolator causes an insertion loss and decreases the electric power efficiency of a circuit. Thus, in the above conventional radio transmission apparatuses 500 and 600, it is difficult to reduce the size and the thickness thereof because the isolator is used therein. Further, it is difficult to increase the electric power efficiency.

SUMMARY OF THE INVENTION

Therefore, an object of the present invention is to provide a radio transmission apparatus and a radio transmission method that, without using an isolator, avoid deterioration of a transmission signal that is caused due to the influence of a variation of the output impedance of an amplification section and a reflected wave returning from an antenna.

The present invention is directed to a radio transmission apparatus for transmitting a transmission signal by radio. In order to achieve the above object, the radio transmission apparatus of the present invention includes: an amplification section that generates a transmission signal by a signal amplification process; a power supply section that supplies an electric power to the amplification section; an antenna that transmits the transmission signal generated by the amplification section; a current detection section that detects an output current of the power supply section that varies in response to a variation of an output impedance of the amplification section; an LUT holding section that holds: a standard table that corrects a distortion of an input/output characteristic of the amplification section that is obtained when the output current of the power supply section is within a predetermined range; and a correction table that corrects a distortion of the input/output characteristic of the amplification section that is obtained when the output current of the power supply section is greater than the predetermined range; a distortion correction section that adjusts a signal inputted to the amplification section, based on the standard table or the correction table to correct a distortion of the input/output characteristic of the amplification section; and a distortion control section that instructs the distortion correction section: to use the standard table until the output current of the power supply section exceeds a first threshold that is an upper limit of the predetermined range; to use the correction table from the time when the output current of the power supply section exceeds the first threshold to the time when the output current of the power supply section becomes less than a second threshold that is less than the first threshold; and to use the standard table from the time when the output current of the power supply section becomes less than the second threshold to the time when the output current of the power supply section exceeds the first threshold again.

Further, in the present invention, the amplification section may amplifys a quadrature modulated signal to generate the transmission signal.

Further, in the present invention, the radio transmission apparatus may also include an amplitude signal amplification section that amplifies an amplitude signal by using the electric power of the power supply section, and the amplification section may amplify a phase signal by using the amplitude signal amplified by the amplitude signal amplification section, to generate the transmission signal. The distortion correction section may include: an amplitude signal distortion correction section that adjusts the amplitude signal inputted to the amplitude signal amplification section, based on the standard table or the correction table to correct an amplitude distortion of the input/output characteristic of the amplification section; and a phase signal distortion correction section that adjusts the phase signal inputted to the amplification section, based on the standard table or the correction table to correct a phase distortion of the input/output characteristic of the amplification section.

Further, in the present invention, preferably, the distortion control section instructs the distortion correction section: to use the standard table until the output current of the power supply section continuously exceeds the first threshold for a predetermined period; to use the correction table from the time when the output current of the power supply section continuously exceeds the first threshold for the predetermined period to the time when the output current of the power supply section continuously falls below the second threshold for the predetermined period; and to use the standard table from the time when the output current of the power supply section continuously falls below the second threshold for the predetermined period to the time when the output current of the power supply section continuously exceeds the first threshold for the predetermined period again.

Alternatively, in order to achieve the above object, the radio transmission apparatus of the present invention includes an amplification section that generates a transmission signal by a signal amplification process; a power supply section that supplies an electric power to the amplification section; an antenna that transmits the transmission signal generated by the amplification section; a current detection section that detects an output current of the power supply section that varies in response to a variation of an output impedance of the amplification section; an LUT holding section that holds: a standard table that corrects a distortion of an input/output characteristic of the amplification section that is obtained when the output current of the power supply section is within a predetermined range; and a correction table that corrects a distortion of the input/output characteristic of the amplification section that is obtained when the output current of the power supply section is less than the predetermined range; a distortion correction section that adjusts a signal inputted to the amplification section, based on the standard table or the correction table to correct a distortion of the input/output characteristic of the amplification section; and a distortion control section that instructs the distortion correction section: to use the standard table until the output current of the power supply section becomes less than a first threshold that is a lower limit of the predetermined range; to use the correction table from the time when the output current of the power supply section becomes less than the first threshold to the time when the output current of the power supply section exceeds a second threshold that is greater than the first threshold; and to use the standard table from the time when the output current of the power supply section exceeds the second threshold to the time when the output current of the power supply section becomes less than the first threshold again.

Further, in the present invention, the amplification section may amplify a quadrature modulated signal to generate the transmission signal.

Further, in the present invention, the radio transmission apparatus may also include an amplitude signal amplification section that amplifies an amplitude signal by using the electric power of the power supply section, and the amplification section may amplify a phase signal by using the amplitude signal amplified by the amplitude signal amplification section, to generate the transmission signal. The distortion correction section may include: an amplitude signal distortion correction section that adjusts the amplitude signal inputted to the amplitude signal amplification section, based on the standard table or the correction table to correct an amplitude distortion of the input/output characteristic of the amplification section; and a phase signal distortion correction section that adjusts a phase signal inputted to the amplification section, based on the standard table or correction table to correct a phase distortion of the input/output characteristic of the amplification section.

Further, in the present invention, preferably, the distortion control section instructs the distortion correction section: to use the standard table until the output current of the power supply section continuously falls below the first threshold for a predetermined period; to use the correction table from the time when the output current of the power supply section continuously falls below the first threshold for the predetermined period to the time when the output current of the power supply section continuously exceeds the second threshold for the predetermined period; and to use the standard table from the time when the output current of the power supply section continuously exceeds the second threshold for the predetermined period to the time when the output current of the power supply section continuously falls below the second threshold for the predetermined period again.

Further, the present invention is directed to a mobile phone. In order to achieve the above object, the mobile phone of the present invention includes the aforementioned radio transmission apparatus of the present invention.

Further, the present invention is directed to a radio transmission method for transmitting a transmission signal by radio. In order to achieve the above object, the radio transmission method of the present invention includes: an amplification step of generating a transmission signal by an amplification section to which an electric power is supplied from a power supply section; a transmission step of transmitting the transmission signal generated at the amplification step; a current detection step of detecting an output current of the power supply section that varies in response to a variation of an output impedance of the amplification section; and a distortion correction step of adjusting a signal inputted to the amplification section, based on: a standard table that corrects a distortion of an input/output characteristic of the amplification section that is obtained when the output current of the power supply section is within a predetermined range; or a correction table that corrects a distortion of the input/output characteristic of the amplification section that is obtained when the output current of the power supply section is greater than the predetermined range, to correct a distortion of the input/output characteristic of the amplification section. At the distortion correction step, the standard table is used until the output current of the power supply section exceeds a first threshold that is an upper limit of the predetermined range; the correction table is used from the time when the output current of the power supply section exceeds the first threshold to the time when the output current of the power supply section becomes less than a second threshold that is less than the first threshold; and the standard table is used from the time when the output current of the power supply section becomes less than the second threshold to the time when the output current of the power supply section exceeds the first threshold again.

Alternatively, in order to achieve the above object, the radio transmission method of the present invention includes: an amplification step of generating a transmission signal by an amplification section to which an electric power is supplied from a power supply section; a transmission step of transmitting the transmission signal generated at the amplification step; a current detection step of detecting an output current of the power supply section that varies in response to a variation of an output impedance of the amplification section; and a distortion correction step of adjusting a signal inputted to the amplification section, based on: a standard table that corrects a distortion of an input/output characteristic of the amplification section that is obtained when the output current of the power supply section is within a predetermined range; or a correction table that corrects a distortion of the input/output characteristic of the amplification section that is obtained when the output current of the power supply section is less than the predetermined range, to correct a distortion of the input/output characteristic of the amplification section. At the distortion correction step, the standard table is used until the output current of the power supply section becomes less than a first threshold that is a lower limit of the predetermined range; the correction table is used from the time when the output current of the power supply section becomes less than the first threshold to the time when the output current of the power supply section exceeds a second threshold that is greater than the first threshold; and the standard table is used from the time when the output current of the power supply section exceeds the second threshold to the time when the output current of the power supply section becomes less than the first threshold again.

As described above, in the radio transmission apparatus and the radio transmission method of the present invention, the output current of the power supply section that supplies the electric power to the amplification section that generates the transmission signal by the amplification process is detected, and the distortion of the amplification section is corrected by using the LUT (the standard table, the correction table) corresponding to the detected output current. By so doing, the radio transmission apparatus and the radio transmission method of the present invention can avoid deterioration of a transmission signal that is caused due to the influence of a variation of the output impedance of the amplification section and a reflected wave returning from the antenna, without using an isolator.

Further, in the radio transmission apparatus and the radio transmission method of the present invention, the threshold for switching from the correction table to the standard table is set such that it is more difficult to switch from the correction table to the standard table than to switch from the standard table to the correction table. By so doing, in the radio transmission apparatus and the radio transmission method of the present invention, an unstable operation that is caused due to frequent occurrence of switching of the LUT that is caused by a slight variation of the output impedance of the amplification section can be avoided, and hence a more stable communication state can be maintained.

The present invention is applicable to a radio transmission apparatus, a radio transmission method, and the like. In particular, the present invention is advantageous, for example, when deterioration of a transmission signal is desired to be avoided without using an isolator.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a flow chart for explaining an operation of the radio transmission apparatus 100 according to the first embodiment of the present invention;

FIG. 3 shows the input/output characteristic of an amplification section 107 of the radio transmission apparatus 100 of the present invention that is obtained when the output impedance of the amplification section 107 varies;

FIG. 6 shows the input/output characteristic of the radio transmission apparatus 100 of the present invention;

FIG. 9 shows the input/output characteristic of an amplification section 211 of the radio transmission apparatus 200 of the present invention that is obtained when the output impedance of the amplification section 211 varies;

FIG. 10 represents a standard LUT, a correction LUT 1, and a correction LUT 2, which are held by an LUT holding section 207 of the radio transmission apparatus 200 of the present invention, by using two graphs for convenience of explanation;

FIG. 16 represents an LUT held by an LUT holding section 503 of the conventional radio transmission apparatus 500, by using two graphs for convenience of explanation;

FIG. 20 represents an LUT held by an LUT holding section 607 of the conventional radio transmission apparatus 600, by using two graphs for convenience of explanation; and FIG. 21 shows the input/output characteristic of the conventional radio transmission apparatus 600.

DESCRIPTION OF THE PREFERRED EMBODIMENTS

First Embodiment

Figure 1:
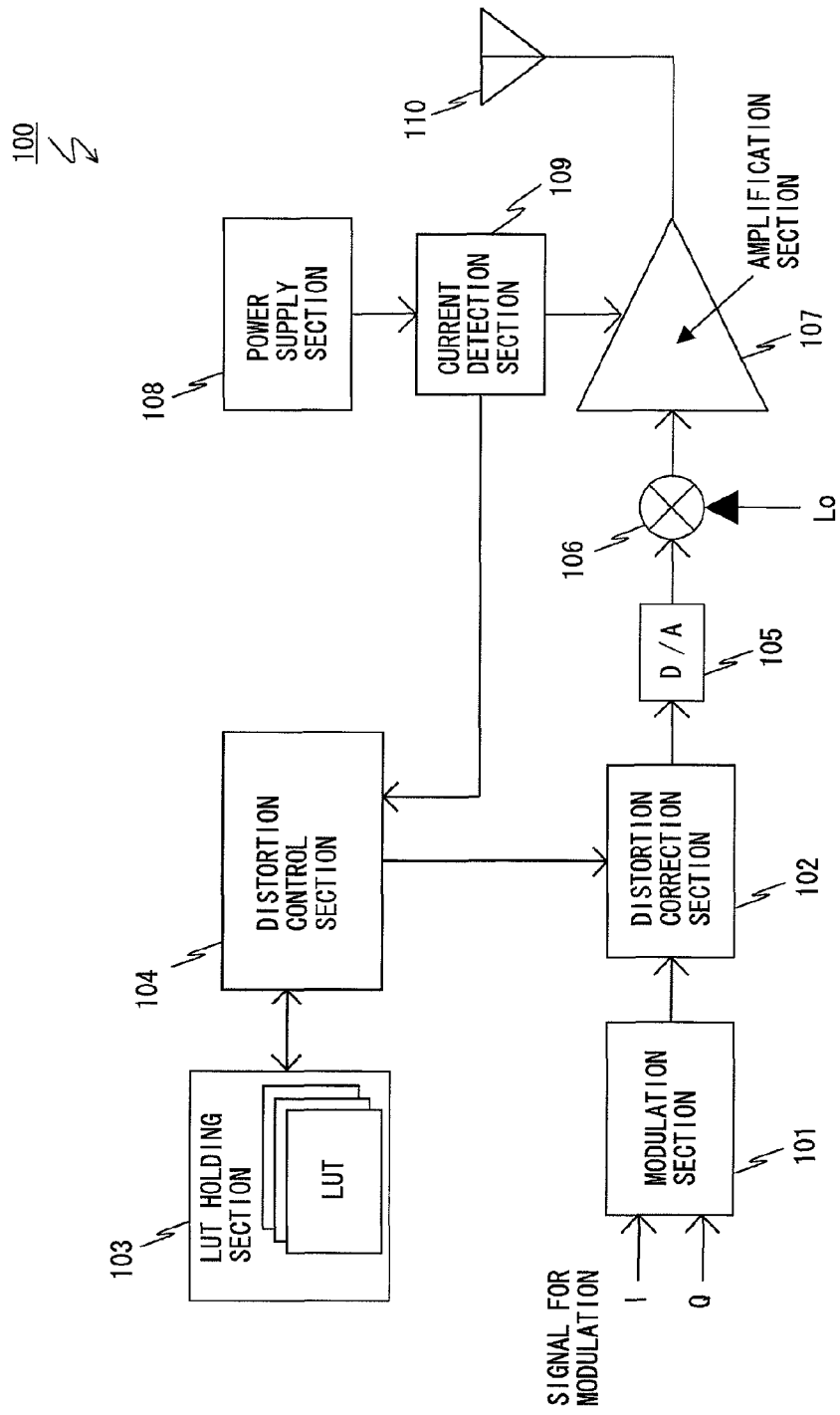
FIG. 1 is a block diagram showing an exemplary configuration of a radio transmission apparatus 100 according to a first embodiment of the present invention.

FIG. 1 is a block diagram showing an exemplary configuration of a radio transmission apparatus 100 according to a first embodiment. The radio transmission apparatus 100 is a radio transmission apparatus that modulates data using a quadrature modulation scheme and transmits the modulated data. As shown in FIG. 1, the radio transmission apparatus 100 includes a modulation section 101, a distortion correction section 102, a look-up table holding section (hereinafter, referred to as an LUT holding section) 103, a distortion control section 104, a digital/analogue conversion section (hereinafter, referred to as a D/A) 105, a mixer 106, an amplification section 107, a power supply section 108, a current detection section 109, and an antenna 110.

FIG. 2 is a flow chart for explaining an operation of the radio transmission apparatus 100 according to the first embodiment. The operation of the radio transmission apparatus 100 will be described below with reference to FIGS. 1 and 2.

First, at step S101, the modulation section 101 generates a quadrature modulated signal by using an I-phase signal and a Q-phase signal that are inputted signals for modulation.

Next, at step S102, in accordance with later-described control of the distortion control section 104, the distortion correction section 102 adjusts the quadrature modulated signal generated by the modulation section 101, to generate an adjusted quadrature modulated signal. The detailed operation of the distortion correction section 102 at step S102 will be described later.

Next, at step S103, the D/A 105 converts the adjusted quadrature modulated signal generated by the distortion correction section 102, from digital form into analogue form.

Next, at step S104, the mixer 106 multiplies the adjusted quadrature modulated signal outputted by the D/A 105, by a local oscillation signal Lo that is a carrier, to generate a transmission signal. It is noted that a local oscillator that generates the local oscillation signal Lo is not shown in FIG. 1.

Next, at step S105, the amplification section 107 amplifies the transmission signal outputted from the mixer 106, by using a driving electric power supplied from the power supply section 108.

Here, the relation between the output impedance and the input/output characteristic of the amplification section 107 will be described. FIG. 3 shows the input/output characteristic of the amplification section 107 that is obtained when the output impedance of the amplification section 107 varies. In FIG. 3(a), the horizontal axis indicates an electric power PIN of an input signal of the amplification section 107, and the vertical axis indicates an electric power POUT of an output signal of the amplification section 107. In FIG. 3(b), the horizontal axis indicates the electric power PIN of the input signal of the amplification section 107, and the vertical axis indicates a shift $\Delta\Phi$ between the phases of the input and output signals of the amplification section 107. In FIGS. 3(a) and 3(b), a standard characteristic is the input/output characteristic of the amplification section 107 that is obtained when the output impedance of the amplification section 107 is within a predetermined setting range and the absolute value of the reflection coefficient $\Gamma$ of an input terminal of the antenna 110 is substantially 0. In addition, a variation characteristic 1 is the input/output characteristic of the amplification section 107 that is obtained when the output impedance of the amplification section 107 is greater than the predetermined setting range and the absolute value of the reflection coefficient $\Gamma$ of the input terminal of the antenna 110 is $\alpha$. Moreover, a variation characteristic 2 is the input/output characteristic of the amplification section 107 that is obtained when the output impedance of the amplification section 107 is less than the predetermined setting range and the absolute value of the reflection coefficient $\Gamma$ of the input terminal of the antenna 110 is $\beta$. As is clear from FIG. 3, the input/output characteristic of the amplification section 107 varies in response to the output impedance of the amplification section 107. As shown in FIG. 3(a), due to the influence of a saturation region, the electric power input/output characteristic of the amplification section 107 becomes nonlinear. In addition, as shown in FIG. 3(b), due to the influence of a saturation region, the shift $\Delta\Phi$ between the phases of the input and output signals of the amplification section 107 varies and does not become constant.

Next, at step S106, the antenna 110 transmits the transmission signal amplified by the amplification section 107, to the exterior space.

On the other hand, at step S107, the current detection section 109 detects a driving current supplied from the power supply section 108 to the amplification section 107, and notifies the distortion control section 104 of the detected driving current.

Here, when the input/output characteristic of the amplification section 107 varies in response to a variation of the output impedance of the amplification section 107 (see FIG. 3), the driving current supplied to the amplification section 107 also varies. Specifically, when the output impedance of the amplification section 107 increases, the driving current of the amplification section 107 decreases, and when the output impedance of the amplification section 107 decreases, the driving current of the amplification section 107 increases. Thus, a variation of the input/output characteristic of the amplification section 107 can be detected by detecting the driving current of the amplification section 107.

Figure 4:
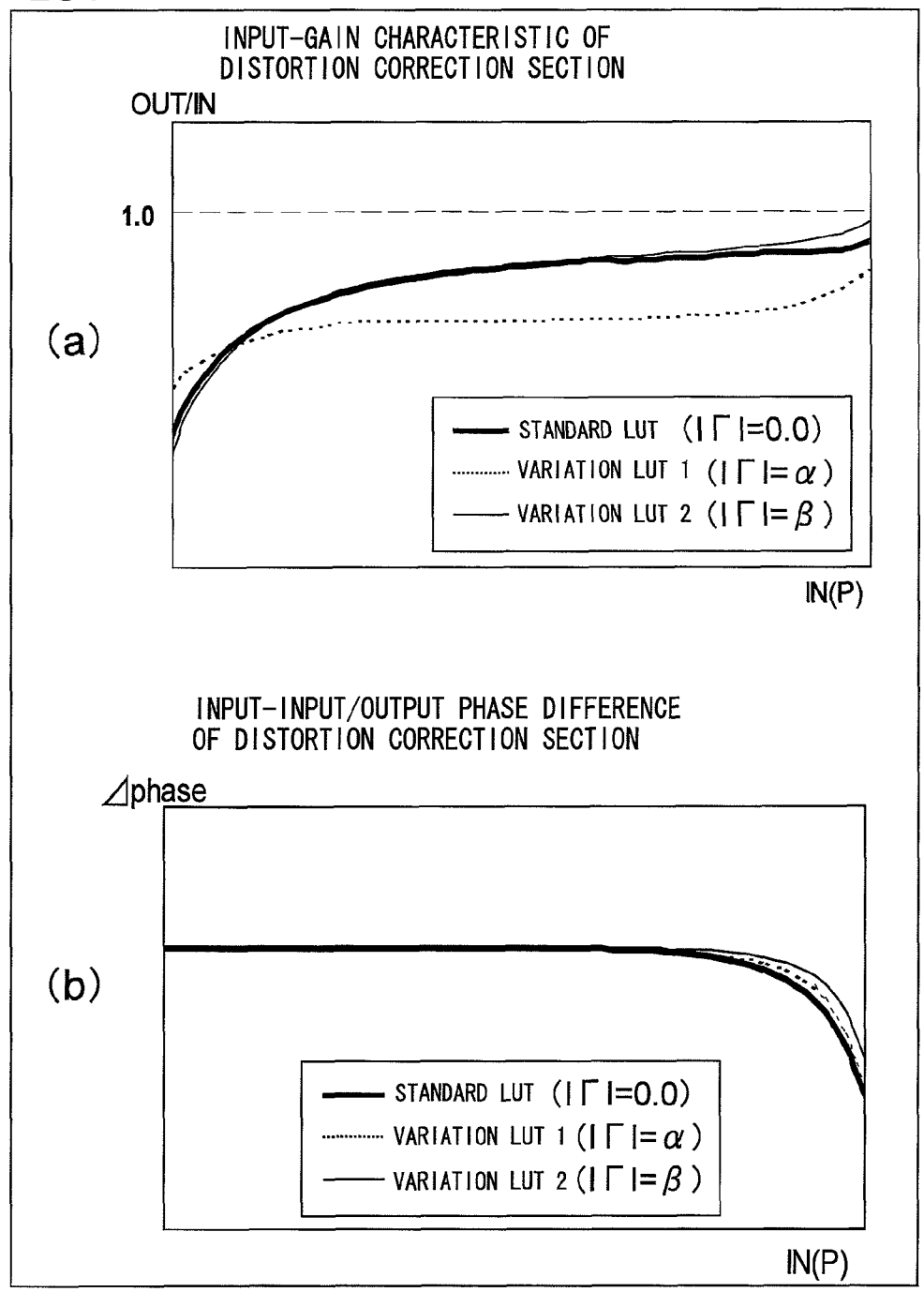
FIG. 4 represents a standard LUT, a correction LUT 1, and a correction LUT 2, which are held by an LUT holding section 103 of the radio transmission apparatus 100 of the present invention, by using two graphs for convenience of explanation.

FIG. 4 represents a standard LUT, a correction LUT 1, and a correction LUT 2, which are held by an LUT holding section 103 of the radio transmission apparatus 100 of the present invention, by using two graphs for convenience of explanation. The graph of FIG. 4(a) is used for adjusting the electric power PIN of the input signal of the amplification section 107. In the graph of FIG. 4(a), the horizontal axis indicates an electric power IN of an input signal of the distortion correction section 102, and the vertical axis indicates a gain (OUT/IN) given to the electric power IN of this input signal by the distortion correction section 102. The graph of FIG. 4(b) is used for adjusting the phase of the input signal of the amplification section 107. In the graph of FIG. 4(b), the horizontal axis indicates the electric power IN of the input signal of the distortion correction section 102, and the vertical axis indicates a phase variation $\Delta$phase given to this input signal by the distortion correction section 102. The standard LUT is set to be a value that corrects a distortion included in the standard characteristic of the amplification section 107 shown in FIG. 3. In other words, the standard LUT is set to be a value that corrects a distortion of the input/output characteristic of the amplification section 107 that is obtained when the output impedance of the amplification section 107 is within the predetermined setting range. In addition, the correction LUT 1 is set to be a value that corrects a distortion included in the variation characteristic 1 of the amplification section 107 shown in FIG. 3. In other words, the correction LUT 1 is set to be a value that corrects a distortion of the input/output characteristic of the amplification section 107 that is obtained when the output impedance of the amplification section 107 is greater than the predetermined setting range. Moreover, the correction LUT 2 is set to be a value that corrects a distortion included in the variation characteristic 2 of the amplification section 107 shown in FIG. 3. In other words, the correction LUT 2 is set to be a value that corrects a distortion of the input/output characteristic of the amplification section 107 that is obtained when the output impedance of the amplification section 107 is less than the predetermined setting range.

At step S108, the distortion control section 104 determines one optimum LUT from among the three LUTs held by the LUT holding section 103, based on the current value notified from the current detection section 109, and controls the operation of the distortion correction section 102 at step S102 by using the determined LUT.

Figure 5:
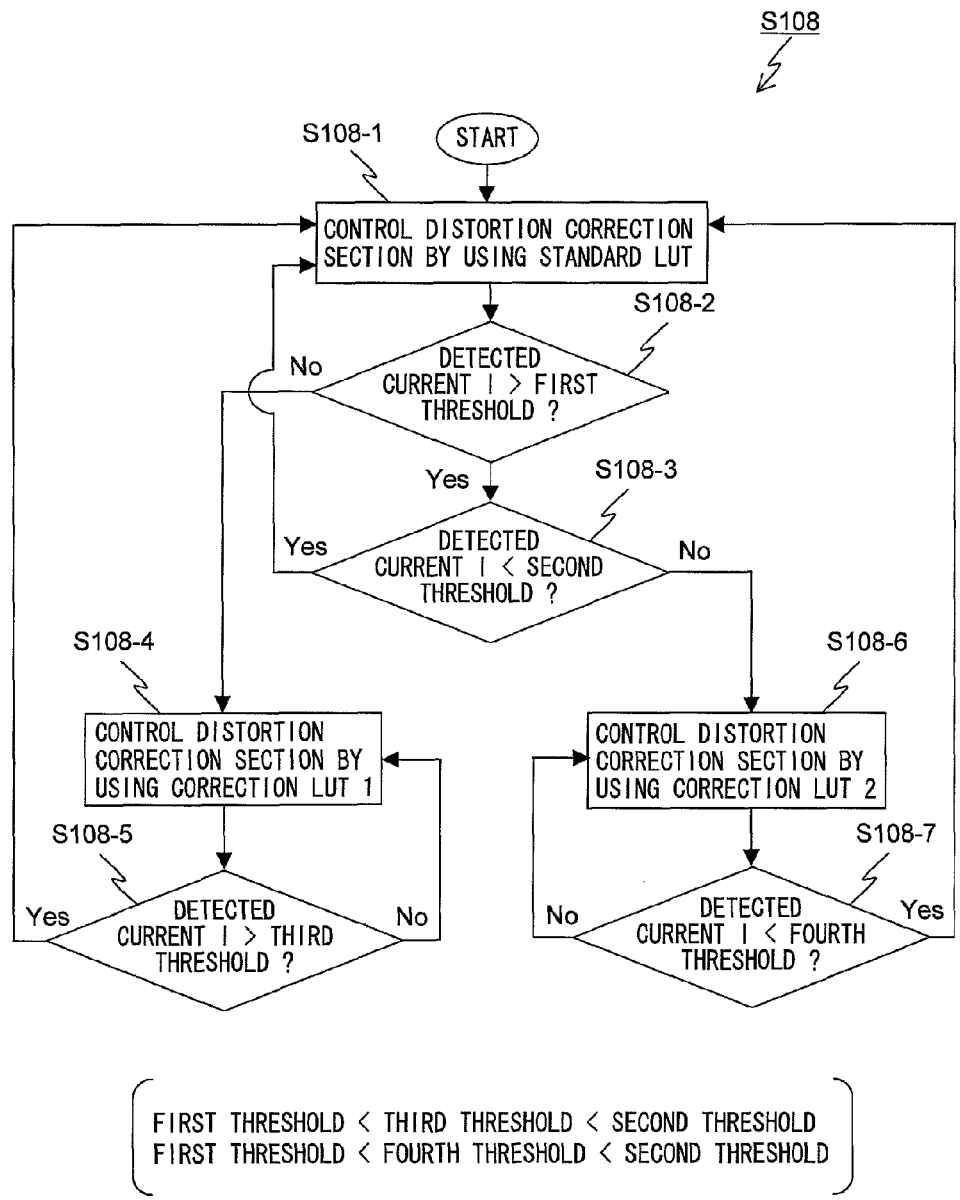
FIG. 5 is a flow chart for explaining in detail an operation of a distortion control section 104 at step S108 in FIG. 2.

FIG. 5 is a flow chart for explaining in detail an operation of the distortion control section 104 at step S108 in FIG. 2. Step S108 will be described in detail below with reference to FIG. 5. For convenience of explanation, the flow chart of FIG. 5 starts with a state where the distortion control section 104 controls the operation of the distortion correction section 102 by using the standard LUT.

First, at step S108-1, the distortion control section 104 controls the operation of the distortion correction section 102 by using the standard LUT.

Next, at step S108-2, the distortion control section 104 determines whether or not a current I detected by the current detection section 109 is greater than a first threshold. When the current I is greater than the first threshold, the distortion control section 104 proceeds to step S108-3. On the other hand, when the current I is not greater than the first threshold, the distortion control section 104 proceeds to step S108-4.

At step S108-3, the distortion control section 104 determines whether or not the current I detected by the current detection section 109 is less than a second threshold. When the current I is less than the second threshold, the distortion control section 104 returns to step S108-1. On the other hand, the current I is not less than the second threshold, the distortion control section 104 proceeds to step S108-6.

In other words, when the current I detected by the current detection section 109 falls between the first threshold and the second threshold, the distortion control section 104 controls the operation of the distortion correction section 102 by using the standard LUT. Here, the first threshold is a value corresponding to the upper limit of the predetermined setting range for the output impedance of the amplification section 107. In addition, the second threshold is a value corresponding to the lower limit of the predetermined setting range for the output impedance of the amplification section 107. In other words, a current range (hereinafter, referred to as a predetermined driving current range) defined between the first threshold and the second threshold corresponds to the predetermined setting range for the output impedance of the amplification section 107, and the second threshold is greater than the first threshold.

On the other hand, at step S108-4, the distortion control section 104 controls the operation of the distortion correction section 102 by using the correction LUT 1.

Next, at step S108-5, the distortion control section 104 determines whether or not the current I detected by the current detection section 109 is greater than a third threshold. When the current I is greater than the third threshold, the distortion control section 104 returns to step S108-1. On the other hand, when the current I is not greater than the third threshold, the distortion control section 104 returns to step S108-4. Here, the third threshold is greater than the first threshold and less than the second threshold.

In other words, at the time when the current I decreases to the lower limit of the predetermined driving current range (first threshold), the distortion control section 104 switches from the standard LUT to the correction LUT 1, and controls the operation of the distortion correction section 102 by using the correction LUT 1. Further, until the current I increases to the third threshold that is greater than the lower limit of the predetermined driving current range, the distortion control section 104 controls the operation of the distortion correction section 102 by using the correction LUT 1. At the time when the current I increases to the third threshold, the distortion control section 104 switches from the correction LUT 1 to the standard LUT, and controls the operation of the distortion correction section 102 by using the standard LUT.

As described above, the third threshold, which is used for switching (returning) from the correction LUT 1 to the standard LUT, is caused to be greater than the first threshold that is used for switching from the standard LUT to the correction LUT 1. Thus, hysteresis is provided, and switching between the standard LUT and the correction LUT 1 is prevented from frequently occurring.

Further, similarly, at step S108-6, the distortion control section 104 controls the operation of the distortion correction section 102 by using the correction LUT 2.

Next, at step S108-7, the distortion control section 104 determines whether or not the current I detected by the current detection section 109 is less than a fourth threshold. When the current I is less than the fourth threshold, the distortion control section 104 returns to step S108-1. On the other hand, when the current I is not less than the fourth threshold, the distortion control section 104 returns to step S108-6. Here, the fourth threshold is greater than the first threshold and less than the second threshold.

In other words, at the time when the current I increases to the upper limit of the predetermined driving current range (second threshold), the distortion control section 104 switches from the standard LUT to the correction LUT 2, and controls the operation of the distortion correction section 102 by using the correction LUT 2. Further, until the current I decreases to the fourth threshold that is less than the upper limit of the predetermined driving current range, the distortion control section 104 controls the operation of the distortion correction section 102 by using the correction LUT 2. At the time when the current I decreases to the fourth threshold, the distortion control section 104 switches from the correction LUT 2 to the standard LUT, and controls the operation of the distortion correction section 102 by using the standard LUT.

As described above, the fourth threshold, which is used for switching (returning) from the correction LUT 2 to the standard LUT, is caused to be less than the second threshold that is used for switching from the standard LUT to the correction LUT 2. Thus, hysteresis is provided, and switching between the standard LUT and the correction LUT 2 is prevented from frequently occurring.

Next, the operation of the distortion correction section 102 at step S102 will be described in detail. At step S102, when the distortion control section 104 performs a control operation by using the standard LUT, the distortion correction section 102 gives a gain to the electric power IN of the quadrature modulated signal generated by the modulation section 101, based on the standard LUT, and also gives a phase variation Δphase to the quadrature modulated signal generated by the modulation section 101, based on the standard LUT (see FIG. 4). Similarly, at step S102, when the distortion control section 104 performs a control operation by using the correction LUT 1, the distortion correction section 102 gives a gain to the electric power IN of the quadrature modulated signal generated by the modulation section 101, based on the correction LUT 1, and also gives a phase variation Δphase to the quadrature modulated signal generated by the modulation section 101, based on the correction LUT 1. Moreover, similarly, at step S102, when the distortion control section 104 performs a control operation by using the correction LUT 2, the distortion correction section 102 gives a gain to the electric power IN of the quadrature modulated signal generated by the modulation section 101, based on the correction LUT 2, and also 102 gives a phase variation Δphase to the quadrature modulated signal generated by the modulation section 101, based on the correction LUT 2.

FIG. 6 is graphs showing the relation between the quadrature modulated signal inputted to the distortion correction section 102 and the output signal of the amplification section 107. In other words, FIG. 6 shows the input/output characteristic of the radio transmission apparatus 100. In FIG. 6(a), the horizontal axis indicates the electric power IN of the input signal of the distortion correction section 102, and the vertical axis indicates the electric power POUT of the output signal of the amplification section 107. In other words, FIG. 6(a) shows the electric power input/output characteristic of the radio transmission apparatus 100. In FIG. 6(b), the horizontal axis indicates the electric power IN of the input signal of the distortion correction section 102, and the vertical axis indicates a shift ΔΦ between the phase of the input signal of the distortion correction section 102 and the phase of the output signal of the amplification section 107. In other words, FIG. 6(b) shows the phase input/output characteristic of the radio transmission apparatus 100. In FIG. 6, a correction standard characteristic is the input/output characteristic of the radio transmission apparatus 100 that is obtained when the amplification section 107 exhibits the standard characteristic (see FIG. 3). In addition, a correction characteristic 1 is the input/output characteristic of the radio transmission apparatus 100 that is obtained when the amplification section 107 exhibits the variation characteristic 1 (see FIG. 3). Moreover, a correction characteristic 2 is the input/output characteristic of the radio transmission apparatus 100 that is obtained when the amplification section 107 exhibits the variation characteristic 2 (see FIG. 3). As is clear from FIG. 6(a), the electric power input/output characteristic of the radio transmission apparatus 100 have a linear relation even when the electric power input/output characteristic of the amplification section 107 varies as shown in FIG. 3(a). Further, as is clear from FIG. 6(b), in the phase input/output characteristic of the radio transmission apparatus 100, the phase shift $\Delta\Phi$ is maintained constant even when the phase input/output characteristic of the amplification section 107 varies as shown in FIG. 3(b). In other words, even when the input/output characteristic of the amplification section 107 varies as shown in FIG. 3, a distortion of the input/output characteristic of the radio transmission apparatus 100 is corrected as shown in FIG. 6.

As described above, in the radio transmission apparatus 100 according to the first embodiment, the variation of the output impedance of the amplification section 107 is detected by detecting the driving current of the amplification section 107, and the input signal of the amplification section 107 is adjusted based on the LUT corresponding to the detected driving current. By so doing, the radio transmission apparatus 100 can correct distortions of the input and output signals as a whole, even when the input/output characteristic of the amplification section 107 varies due to a variation of the output impedance of the amplification section 107. As a result, without using an isolator, the radio transmission apparatus 100 of the present invention can avoid deterioration of a transmission signal that is caused due to the influence of the variation of the output impedance of the amplification section 107 and a reflected wave that returns from the antenna 110.

Further, as described above, in the radio transmission apparatus 100 according to the first embodiment, the thresholds used as references for switching the LUT are set such that it is more difficult to switch from the correction LUT 1 or the correction LUT 2 to the standard LUT than to switch from the standard LUT to the correction LUT 1 or the correction LUT 2. Thus, the radio transmission apparatus 100 of the present invention can avoid an unstable operation that is caused due to frequent occurrence of switching of the LUT that is caused by a slight variation of the output impedance of the amplification section 107, and hence the radio transmission apparatus 100 can maintain a more stable communication state.

Second Embodiment

Figure 7:
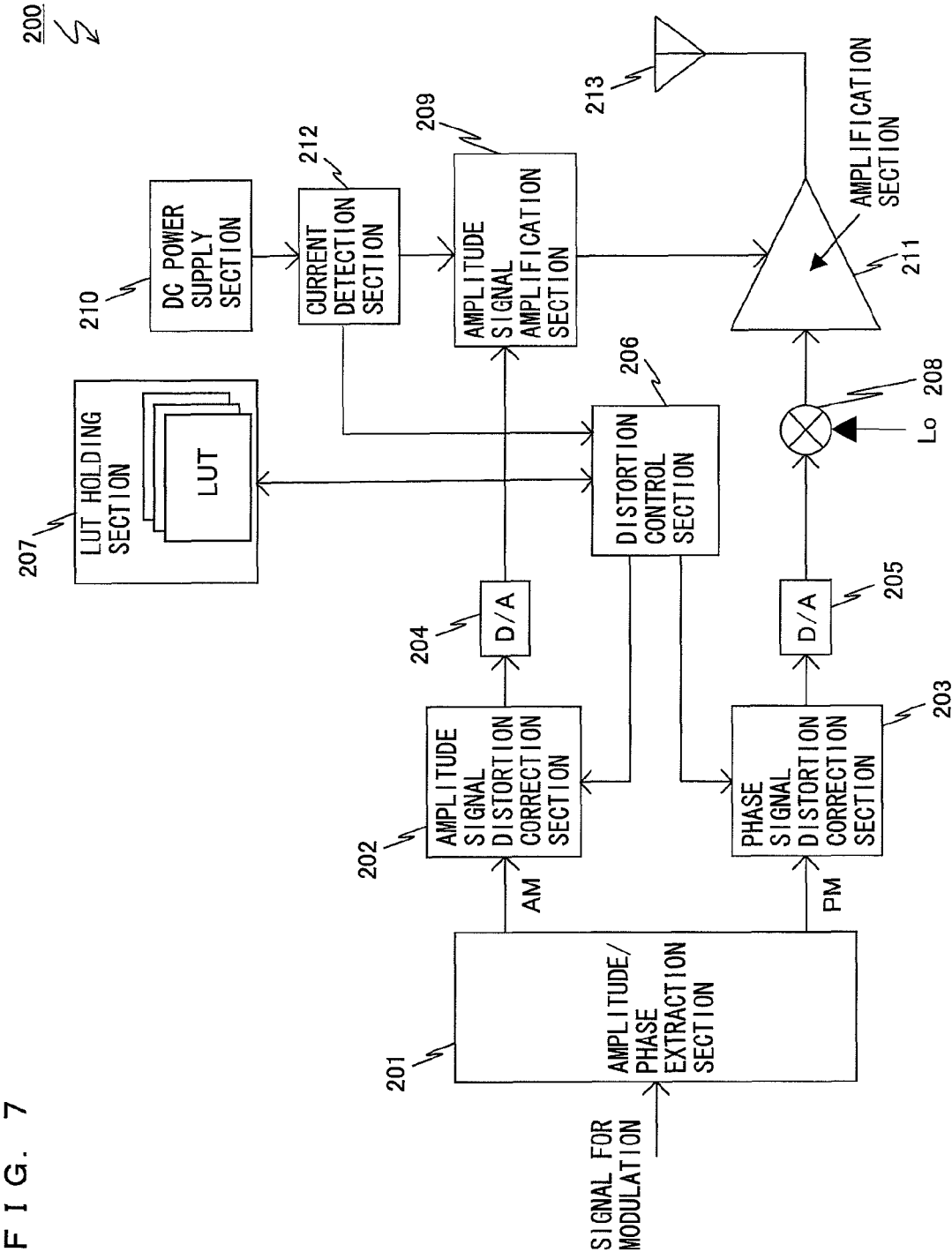
FIG. 7 is a block diagram showing an exemplary configuration of a radio transmission apparatus 200 according to a second embodiment of the present invention.

FIG. 7 is a block diagram showing an exemplary configuration of a radio transmission apparatus 200 according to a second embodiment. The radio transmission apparatus 200 is a radio transmission apparatus that modulates data by using a polar modulation scheme and transmits the modulated data. As shown in FIG. 7, the radio transmission apparatus 200 includes an amplitude/phase extraction section 201, an amplitude signal distortion correction section 202, a phase signal distortion correction section 203, a D/A 204, a D/A 205, a distortion control section 206, an LUT holding section 207, a mixer 208, an amplitude signal amplification section 209, a DC power supply section 210, an amplification section 211, a current detection section 212, and an antenna 213.

Figure 8:
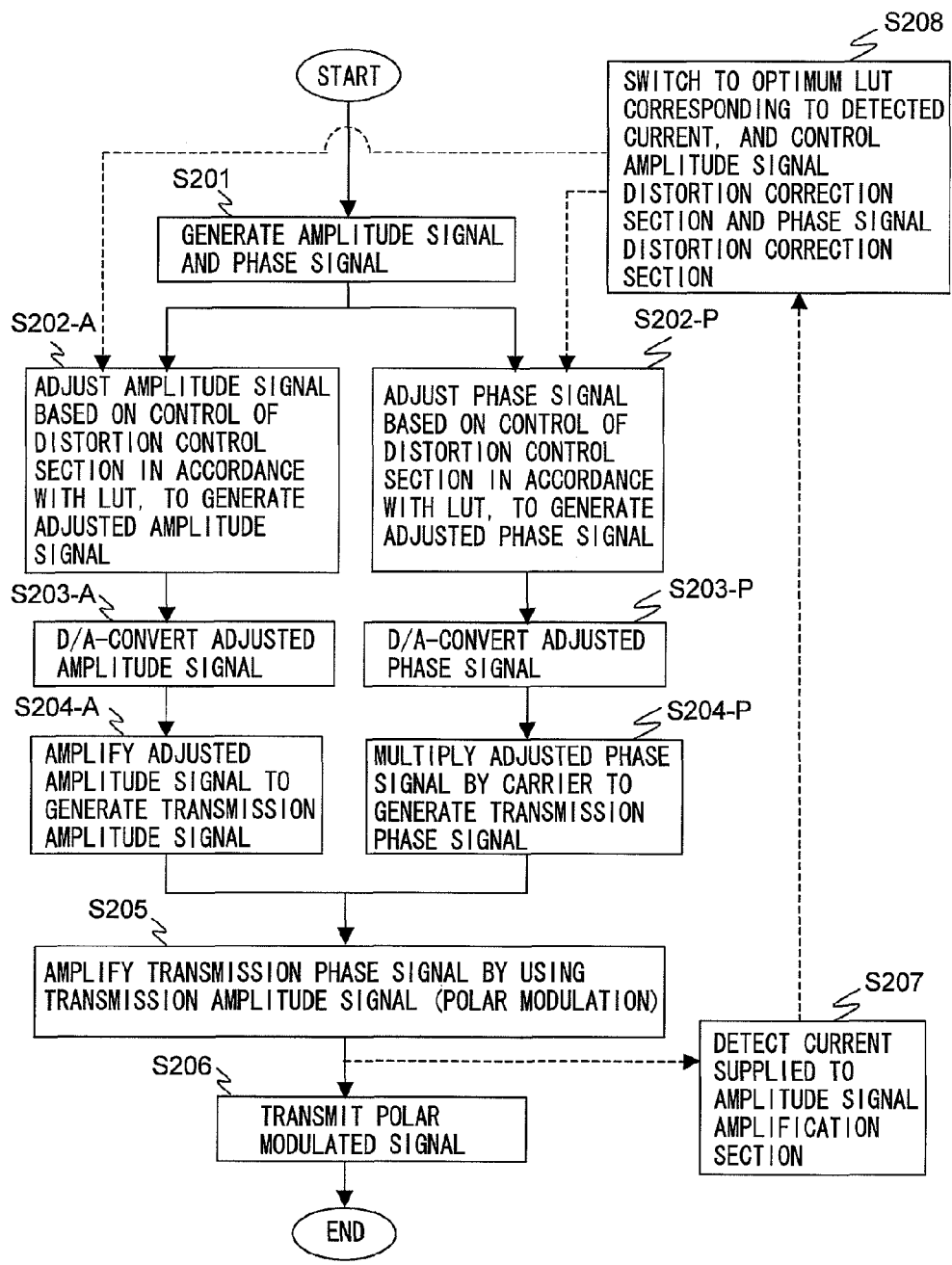
FIG. 8 is a flow chart for explaining an operation of the radio transmission apparatus 200 according to the second embodiment of the present invention.

FIG. 8 is a flow chart for explaining an operation of the radio transmission apparatus 200 according to the second embodiment. The operation of the radio transmission apparatus 200 will be described below with reference to FIGS. 7 and 8.

First, at step S201, the amplitude/phase extraction section 201 extracts an amplitude component of a signal for modulation to generate an amplitude signal, and extracts a phase component of the signal for modulation to generate a phase signal. Then, later-described processes at steps S202-A to S204-A and later-described processes at steps S202-P to S204-P are executed in parallel.

At step S202-A, in accordance with later-described control of the distortion control section 206, the amplitude signal distortion correction section 202 adjusts the amplitude signal generated by the amplitude/phase extraction section 201, to generate an adjusted amplitude signal. The detailed operation of the amplitude signal distortion correction section 202 at step S202-A will be described later.

Next, at step S203-A, the D/A 204 converts the adjusted amplitude signal generated by the amplitude signal distortion correction section 202, from digital form into analogue form.

Next, at step S204-A, the amplitude signal amplification section 209 amplifies the adjusted amplitude signal converted by the D/A 204, by using an electric power supplied from the DC power supply section 210, to generate a transmission amplitude signal.

On the other hand, at step S202-P, in accordance with later-described control of the distortion control section 206, the phase signal distortion correction section 203 adjusts the phase signal generated by the amplitude/phase extraction section 201, to generate an adjusted phase signal. The detailed operation of the phase signal distortion correction section 203 at step S202-P will be described later.

Next, at step S203-P, the D/A 205 converts the adjusted phase signal generated by the phase signal distortion correction section 203, from digital form into analogue form.

Next, at step S204-P, the mixer 208 multiplies the adjusted phase signal outputted by the D/A 205, by a local oscillation signal Lo that is a carrier, to generate a transmission phase signal. It is noted that a local oscillator that generates the local oscillation signal Lo is not shown in FIG. 7.

Subsequent to steps S204-A and S204-P, at step S205, the amplification section 211 amplifies the transmission phase signal outputted from the mixer 208, by using, as a driving electric power, the transmission amplitude signal generated by the amplitude signal amplification section 209, to generate a polar modulated signal.

Here, the relation between the output impedance and the input/output characteristic of the amplification section 211 will be described. FIG. 9 shows the input/output characteristic of the amplification section 211 that is obtained when the output impedance of the amplification section 211 varies. In FIG. 9(a), the horizontal axis indicates a driving voltage VIN supplied to the amplification section 211, and the vertical axis indicates a voltage VOUT of an output signal of the amplification section 211. In FIG. 9(b), the horizontal axis indicates the driving voltage VIN (transmission amplitude signal voltage) supplied to the amplification section 211, and the vertical axis indicates a shift $\Delta\Phi$ between the phase of the phase signal inputted to the amplification section 211 and the phase of the output signal (polar modulated signal) of the amplification section 211. In FIGS. 9(a) and 9(b), a standard characteristic is the input/output characteristic of the amplification section 211 that is obtained when the output impedance of the amplification section 211 is within a predetermined setting range and the absolute value of the reflection coefficient Γ of an input terminal of the antenna 213 is substantially 0. In addition, a variation characteristic 1 is the input/output characteristic of the amplification section 211 that is obtained when the output impedance of the amplification section 211 is greater than the predetermined setting range and the absolute value of the reflection coefficient Γ of the input terminal of the antenna 213 is α. Moreover, a variation characteristic 2 is the input/output characteristic of the amplification section 211 that is obtained when the output impedance of the amplification section 211 is less than the predetermined setting range and the absolute value of the reflection coefficient Γ of the input terminal of the antenna 213 is β. As is clear from FIG. 9, the input/output characteristic of the amplification section 211 varies in response to the output impedance of the amplification section 211. As shown in FIG. 9(a), due to the influence of a saturation region, the relation between the driving voltage VIN (transmission amplitude signal voltage) supplied to the amplification section 211 and the voltage VOUT of the output signal (polar modulated signal) of the amplification section 211 becomes nonlinear. In addition, as shown in FIG. 9((b), due to the influence of a saturation region, the shift ΔΦ between the phase of the transmission phase signal inputted to the amplification section 211 and the phase of the output signal (polar modulated signal) of the amplification section 211 varies and does not become constant.

Next, at step S206, the antenna 213 transmits the polar modulated signal generated by the amplification section 211, to the exterior space.

On the other hand, at step S207, the current detection section 212 detects a current supplied from the DC power supply section 210 to the amplitude signal amplification section 209, and notifies the distortion control section 206 of the detected current.

Here, when the input/output characteristic of the amplification section 211 varies in response to a variation of the output impedance of the amplification section 211 (see FIG. 9), the driving current supplied to the amplification section 211 varies. When the driving current supplied to the amplification section 211 varies, the driving current supplied from the DC power supply section 210 to the amplitude signal amplification section 209 also varies. Specifically, when the output impedance of the amplification section 211 increases, the driving current of the amplification section 211 decreases, and the driving current of the amplitude signal amplification section 209 also decreases. Further, when the output impedance of the amplification section 211 decreases, the driving current of the amplification section 211 increases, and the driving current of the amplitude signal amplification section 209 also increases. Thus, a variation of the input/output characteristic of the amplification section 211 can be detected by detecting the driving current of the amplitude signal amplification section 209. Here, the amplitude signal amplification section 209 is driven in an unsaturation region, and the input/output characteristic of the amplitude signal amplification section 209 has a linear relation.

FIG. 10 represents a standard LUT, a correction LUT 1, and a correction LUT 2, which are held by an LUT holding section 207 of the radio transmission apparatus 200 of the present invention, by using two graphs for convenience of explanation. The graph of FIG. 10(a) is used for adjusting the driving voltage VIN (transmission amplitude signal voltage) supplied to the amplification section 211. In the graph of FIG. 10(a), the horizontal axis indicates a voltage IN of an input signal of the amplitude signal distortion correction section 202, and the vertical axis indicates a gain (OUT/IN) given to the voltage IN of the input signal by the amplitude signal distortion correction section 602. The graph of FIG. 10(b) is used for adjusting the phase of the transmission phase signal inputted to the amplification section 211. In the graph of FIG. 10(b), the horizontal axis indicates the driving voltage VIN (transmission amplitude signal voltage) supplied to the amplification section 211, and the vertical axis indicates a phase variation Δphase given by the phase signal distortion correction section 203 to the phase signal inputted to the phase signal distortion correction section 203. The standard LUT is set to be a value that corrects a distortion included in the standard characteristic of the amplification section 211 shown in FIG. 9. In other words, the standard LUT is set to be a value that corrects a distortion of the input/output characteristic of the amplification section 211 that is obtained when the output impedance of the amplification section 211 is within the predetermined setting range. In addition, the correction LUT 1 is set to be a value that corrects a distortion included in the variation characteristic 1 of the amplification section 211 shown in FIG. 9. In other words, the correction LUT 1 is set to be a value that corrects a distortion of the input/output characteristic of the amplification section 211 that is obtained when the output impedance of the amplification section 211 is greater than the predetermined setting range. Moreover, the correction LUT 2 is set to be a value that corrects a distortion included in the variation characteristic 2 of the amplification section 211 shown in FIG. 9. In other words, the correction LUT 2 is set to be a value that corrects a distortion of the input/output characteristic of the amplification section 211 that is obtained when the output impedance of the amplification section 211 is less than the predetermined setting range.

At step S208, the distortion control section 206 determines one optimum LUT from among the three LUTs held by the LUT holding section 207, based on the current value notified from the current detection section 212, and controls the operation of amplitude signal distortion correction section 202 at step S202-A and the operation of the phase signal distortion correction section 203 at the step S202-P by using the determined LUT.

Figure 11:
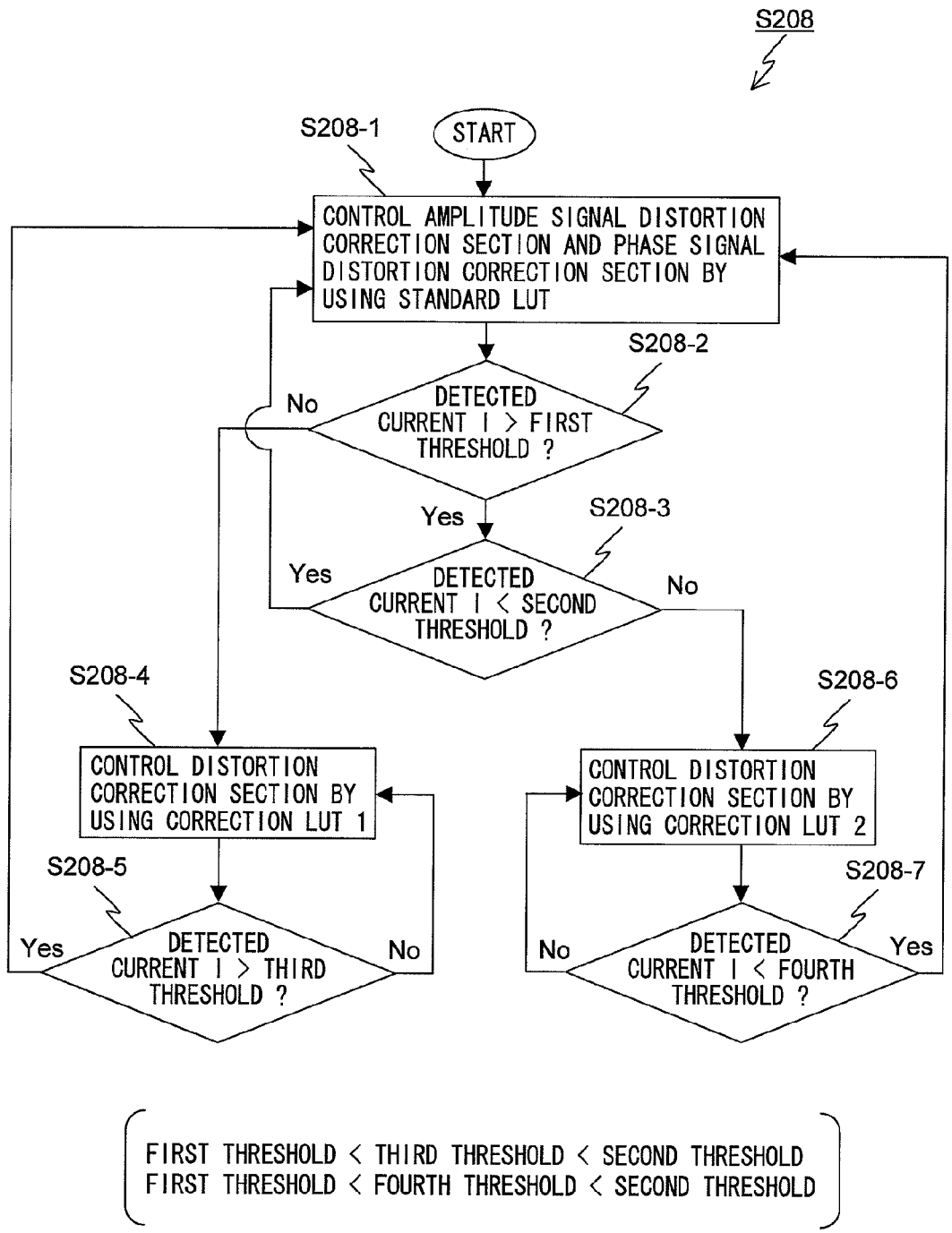
FIG. 11 is a flow chart for explaining in detail an operation of a distortion control section 206 at step S208 in FIG. 8.

FIG. 11 is a flow chart for explaining in detail an operation of the distortion control section 206 at step S208 in FIG. 8. Step S208 will be described in detail below with reference to FIG. 11. For convenience of explanation, the flow chart of FIG. 11 starts with a state where the distortion control section 206 controls the operations of the amplitude signal distortion correction section 202 and the phase signal distortion correction section 203 by using the standard LUT.

First, at step S208-1, the distortion control section 206 controls the operations of the amplitude signal distortion correction section 202 and the phase signal distortion correction section 203 by using the standard LUT.

Next, at step S208-2, the distortion control section 206 determines whether or not a current I detected by the current detection section 212 is greater than a first threshold. When the current I is greater than the first threshold, the distortion control section 206 proceeds to step S208-3. On the other hand, when the current I is not greater than the first threshold, the distortion control section 206 proceeds to step S208-4.

At step S208-3, the distortion control section 206 determines whether or not the current I detected by the current detection section 212 is less than a second threshold. When the current I is less than the second threshold, the distortion control section 206 returns to step S208-1. On the other hand, when the current I is not less than the second threshold, the distortion control section 206 proceeds to step S208-6.

In other words, when the current I detected by the current detection section 212 falls between the first threshold and the second threshold, the distortion control section 206 controls the operations of the amplitude signal distortion correction section 202 and the phase signal distortion correction section 203 by using the standard LUT. Here, the first threshold is a value corresponding to the upper limit of the predetermined setting range for the output impedance of the amplification section 211. In addition, the second threshold is a value corresponding to the lower limit of the predetermined setting range for the output impedance of the amplification section 211. In other words, a current range (hereinafter, referred to as a predetermined driving current range) defined between the first threshold and the second threshold corresponds to the predetermined setting range for the output impedance of the amplification section 211, and the second threshold is greater than the first threshold.

On the other hand, at step S208-4, the distortion control section 206 controls the operations of the amplitude signal distortion correction section 202 and the phase signal distortion correction section 203 by using the correction LUT 1.

Next, at step S208-5, the distortion control section 206 determines whether or not the current I detected by the current detection section 212 is greater than a third threshold. When the current I is greater than the third threshold, the distortion control section 206 returns to step S208-1. On the other hand, when the current I is not greater than the third threshold, the distortion control section 206 returns to step S208-4. Here, the third threshold is greater than the first threshold and less than the second threshold.

In other words, at the time when the current I decreases to the lower limit of the predetermined driving current range (first threshold), the distortion control section 206 switches from the standard LUT to the correction LUT 1, and controls the operations of the amplitude signal distortion correction section 202 and the phase signal distortion correction section 203 by using the correction LUT 1. Further, until the current I increases to the third threshold that is greater than the lower limit of the predetermined driving current range, the distortion control section 206 controls the operations of the amplitude signal distortion correction section 202 and the phase signal distortion correction section 203 by using the correction LUT 1. At the time when the current I increases to the third threshold, the distortion control section 206 switches from the correction LUT 1 to the standard LUT, and controls the operations of the amplitude signal distortion correction section 202 and the phase signal distortion correction section 203 by using the standard LUT.

As described above, the third threshold, which is used for switching (returning) from the correction LUT 1 to the standard LUT, is caused to be greater than the first threshold that is used for switching from the standard LUT to the correction LUT 1. Thus, hysteresis is provided, and switching between the standard LUT and the correction LUT 1 is prevented from frequently occurring.

Further, similarly, at step S208-6, the distortion control section 206 controls the operations of the amplitude signal distortion correction section 202 and the phase signal distortion correction section 203 by using the correction LUT 2.

Next, at step S208-7, the distortion control section 206 determines whether or not the current I detected by the current detection section 212 is less than a fourth threshold. When the current I is less than the fourth threshold, the distortion control section 206 returns to step S208-1. On the other hand, when the current I is not less than the fourth threshold, the distortion control section 206 returns to step S208-6. Here, the fourth threshold is greater than the first threshold and less than the second threshold.

In other words, at the time when the current I increases to the upper limit of the predetermined driving current range (second threshold), the distortion control section 206 switches from the standard LUT to the correction LUT 2, and controls the operations of the amplitude signal distortion correction section 202 and the phase signal distortion correction section 203 by using the correction LUT 2. Further, until the current I decreases to the fourth threshold that is less than the upper limit of the predetermined driving current range, the distortion control section 206 controls the operations of the amplitude signal distortion correction section 202 and the phase signal distortion correction section 203 by using the correction LUT 2. At the time when the current I decreases to the fourth threshold, the distortion control section 206 switches from the correction LUT 2 to the standard LUT, and controls the operations of the amplitude signal distortion correction section 202 and the phase signal distortion correction section 203 by using the standard LUT.

As described above, the fourth threshold, which is used for switching (returning) from the correction LUT 2 to the standard LUT, is caused to be less than the second threshold that is used for switching from the standard LUT to the correction LUT 2. Thus, hysteresis is provided, and switching between the standard LUT and the correction LUT 2 is prevented from frequently occurring.

Next, the operation of the amplitude signal distortion correction section 202 at step S202-A and the operation of the phase signal distortion correction section 203 at step S202-P will be described in detail. When the distortion control section 206 performs a control operation by using the standard LUT, the amplitude signal distortion correction section 202 gives a gain to the voltage IN of the amplitude signal generated by the amplitude/phase extraction section 201, based on the standard LUT at step S202-A, and the phase signal distortion correction section 203 gives a phase variation Δphase to the phase signal generated by the amplitude/phase extraction section 201, based on the standard LUT at step S202-P (see FIG. 10). Similarly, when the distortion control section 206 performs a control operation by using the correction LUT 1, the amplitude signal distortion correction section 202 gives a gain to the voltage IN of the amplitude signal generated by the amplitude/phase extraction section 201, based on the correction LUT 1 at step S202-A, and the phase signal distortion correction section 203 gives a phase variation Δphase to the phase signal generated by the amplitude/phase extraction section 201, based on the correction LUT 1 at step S202-P. Moreover, similarly, when the distortion control section 206 performs a control operation by using the correction LUT 2, the amplitude signal distortion correction section 202 gives a gain to the voltage IN of the amplitude signal generated by the amplitude/phase extraction section 201, based on the correction LUT 2 at step S202-A, and the phase signal distortion correction section 203 gives a phase variation Δphase to the phase signal generated by the amplitude/phase extraction section 201, based on the correction LUT 2 at step S202-P.

Figure 12:
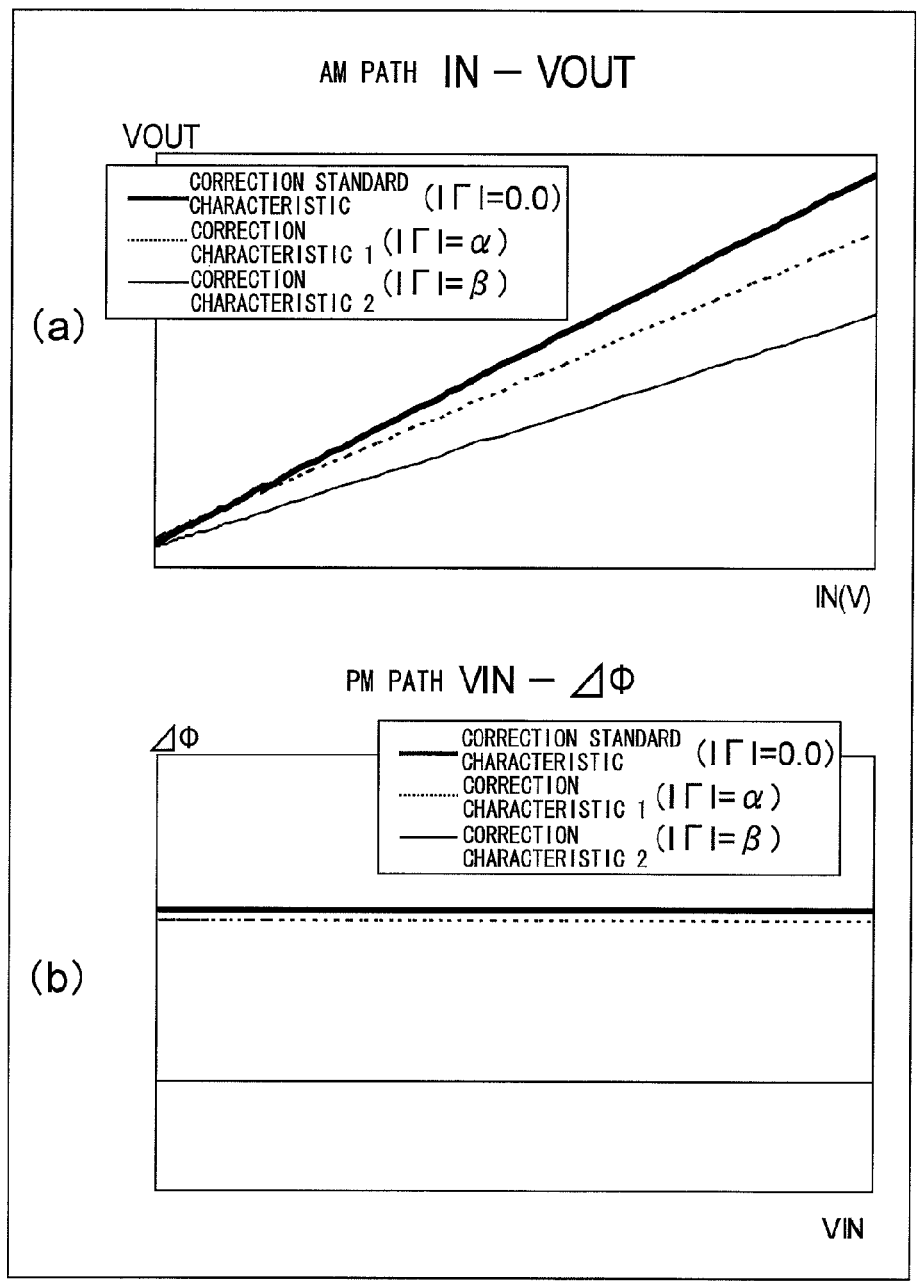
FIG. 12 shows the input/output characteristic of the radio transmission apparatus 200 of the present invention.

FIG. 12 is graphs respectively showing the relation between the amplitude signal inputted to the amplitude signal distortion correction section 202 and the output signal (polar modulated signal) of the amplification section 211 and the relation between the phase of the phase signal inputted to the phase signal distortion correction section 203 and the phase of the output signal (polar modulated signal) of the amplification section 211. In other words, FIG. 12 shows the input/output characteristic of the radio transmission apparatus 200. In FIG. 12, a correction standard characteristic is the input/output characteristic of the radio transmission apparatus 200 that is obtained when the amplification section 211 exhibits the standard characteristic (see FIG. 9). In addition, a correction characteristic 1 is the input/output characteristic of the radio transmission apparatus 200 that is obtained when the amplification section 211 exhibits the variation characteristic 1 (see FIG. 9). Moreover, a correction characteristic 2 is the input/output characteristic of the radio transmission apparatus 200 that is obtained when the amplification section 211 exhibits the variation characteristic 2 (see FIG. 9). As shown in FIG. 12(a), the voltage IN of the amplitude signal inputted to the amplitude signal distortion correction section 202 and the voltage VOUT of the output signal of the amplification section 211 are corrected so as to have a linear relation therebetween by the aforementioned process of the amplitude signal distortion correction section 202, even when the voltage input/output characteristic of the amplification section 211 varies as shown in FIG. 9(a). Further, as shown in FIG. 12(b), the shift ΔΦ between the phase of the phase signal inputted to the phase signal distortion correction section 203 and the phase of the output signal of the amplification section 211 is corrected so as to be constant by the aforementioned process of the phase signal distortion correction section 203, even when the phase input/output characteristic of the amplification section 211 varies as shown in FIG. 9(b). In other words, even when the input/output characteristic of the amplification section 211 varies as shown in FIG. 9, a distortion of the input/output characteristic of the radio transmission apparatus 200 is corrected as shown in FIG. 12.

As described above, in the radio transmission apparatus 200 according to the second embodiment, the variation of the output impedance of the amplification section 211 is detected by detecting the driving current of the amplitude signal amplification section 209, and the input signal of the amplification section 211 is adjusted based on the LUT corresponding to the detected driving current. By so doing, the radio transmission apparatus 200 can correct distortions of the input and output signals as a whole, even when the input/output characteristic of the amplification section 211 varies due to a variation of the output impedance of the amplification section 211. As a result, without using an isolator, the radio transmission apparatus 200 of the present invention can avoid deterioration of a transmission signal that is caused due to the influence of the variation of the output impedance of the amplification section 211 and a reflected wave that returns from the antenna 213.

Further, as described above, in the radio transmission apparatus 200 according to the second embodiment, the thresholds used as references for switching the LUT are set such that it is more difficult to switch from the correction LUT 1 or the correction LUT 2 to the standard LUT than to switch from the standard LUT to the correction LUT 1 or the correction LUT 2. Thus, the radio transmission apparatus 200 of the present invention can avoid an unstable operation that is caused due to frequent occurrence of switching of the LUT that is caused by a slight variation of the output impedance of the amplification section 211, and hence the radio transmission apparatus 200 can maintain a more stable communication state.

In the aforementioned first and second embodiments, the LUT to be used is switched among the three LUTs in accordance with the three output impedance states, namely, the state where the output impedance of the amplification section (107, 211) is within the predetermined setting range (a steady state), the state where the output impedance is less than the predetermined setting range, and the state where the output impedance is greater than the predetermined setting range, and a distortion of the transmission signal of the radio transmission apparatus (100, 200) is corrected. However, in the aforementioned first and second embodiments, in order to correct the distortion of the transmission signal with higher accuracy, the LUT to be used may be switched among four LUTs in accordance with four output impedance states, and the distortion of the transmission signal of the radio transmission apparatus (100, 200) may be corrected.

Further, in the aforementioned first and second embodiments, the distortion control section (104, 206) switches the LUT to be used, at the time when the current detected by the current detection section (109, 212) becomes a predetermined threshold. However, in the aforementioned first and second embodiments, the distortion control section (104, 206) may switch the LUT to be used, at the time when the current detected by the current detection section (109, 212) continuously exceeds a predetermined threshold during a predetermined sampling period. By so doing, the radio transmission apparatus (100, 200) of the present invention can maintain a more stable communication state, for example, because a variation of the output impedance of the amplification section (107, 211) that is caused due to a change of the orientation of the radio transmission apparatus (100, 200) held by a user, and the like and that converges in a short time, can be neglected.

Figure 13:
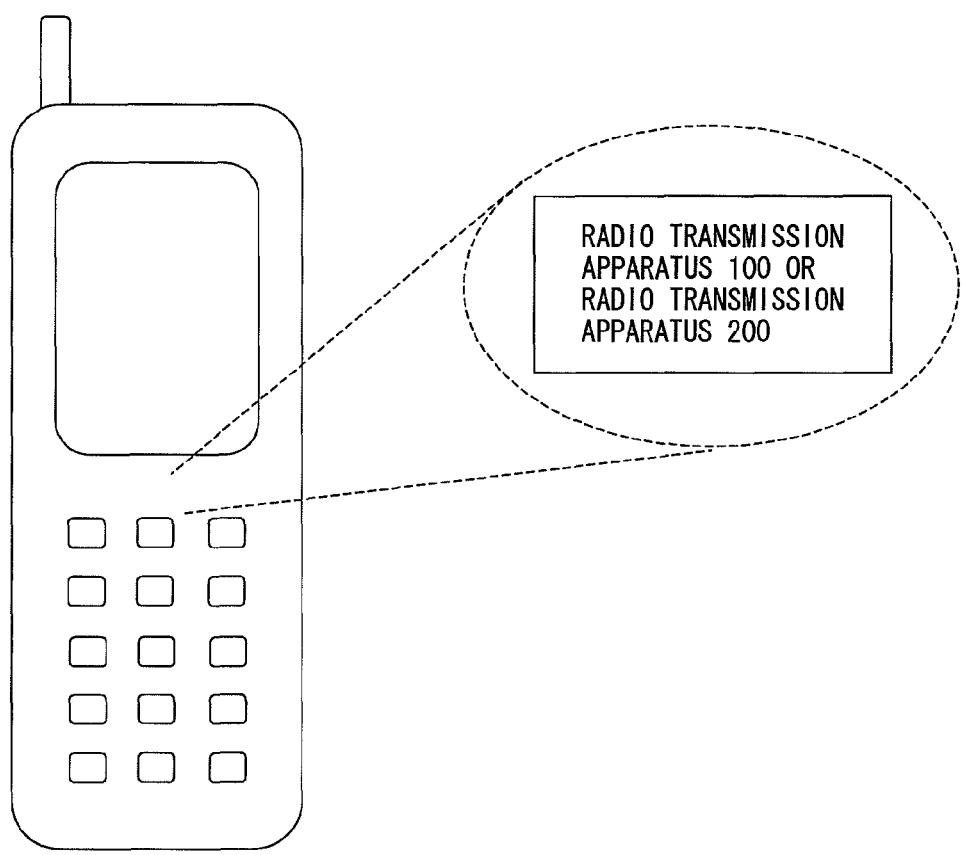
FIG. 13 shows a mobile phone including the radio transmission apparatus 100 or the radio transmission apparatus 200 of the present invention.
Figure 14:
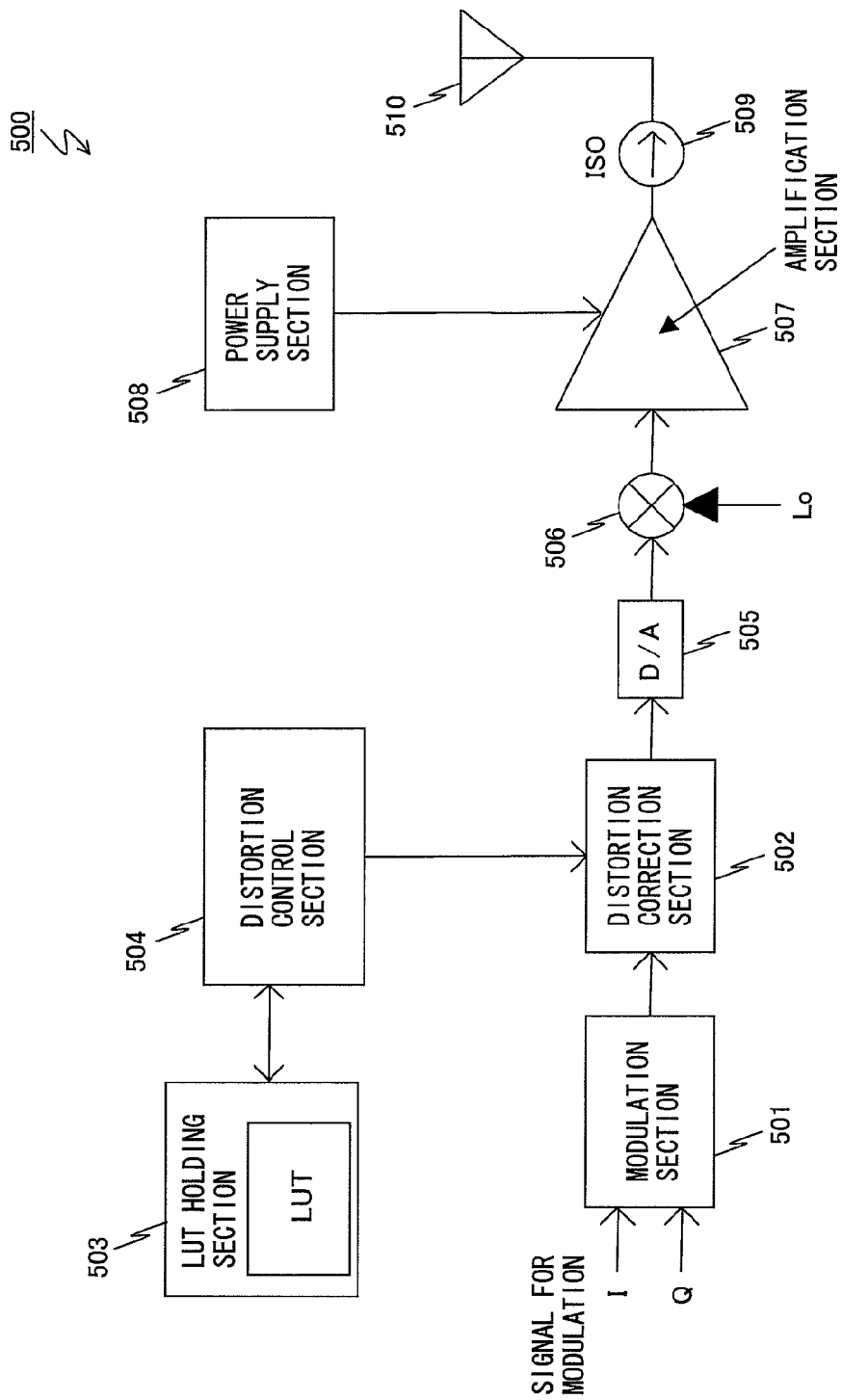
FIG. 14 shows an example of a conventional radio transmission apparatus 500 that modulates data using a quadrature modulation scheme and transmits the modulated data.
Figure 15:
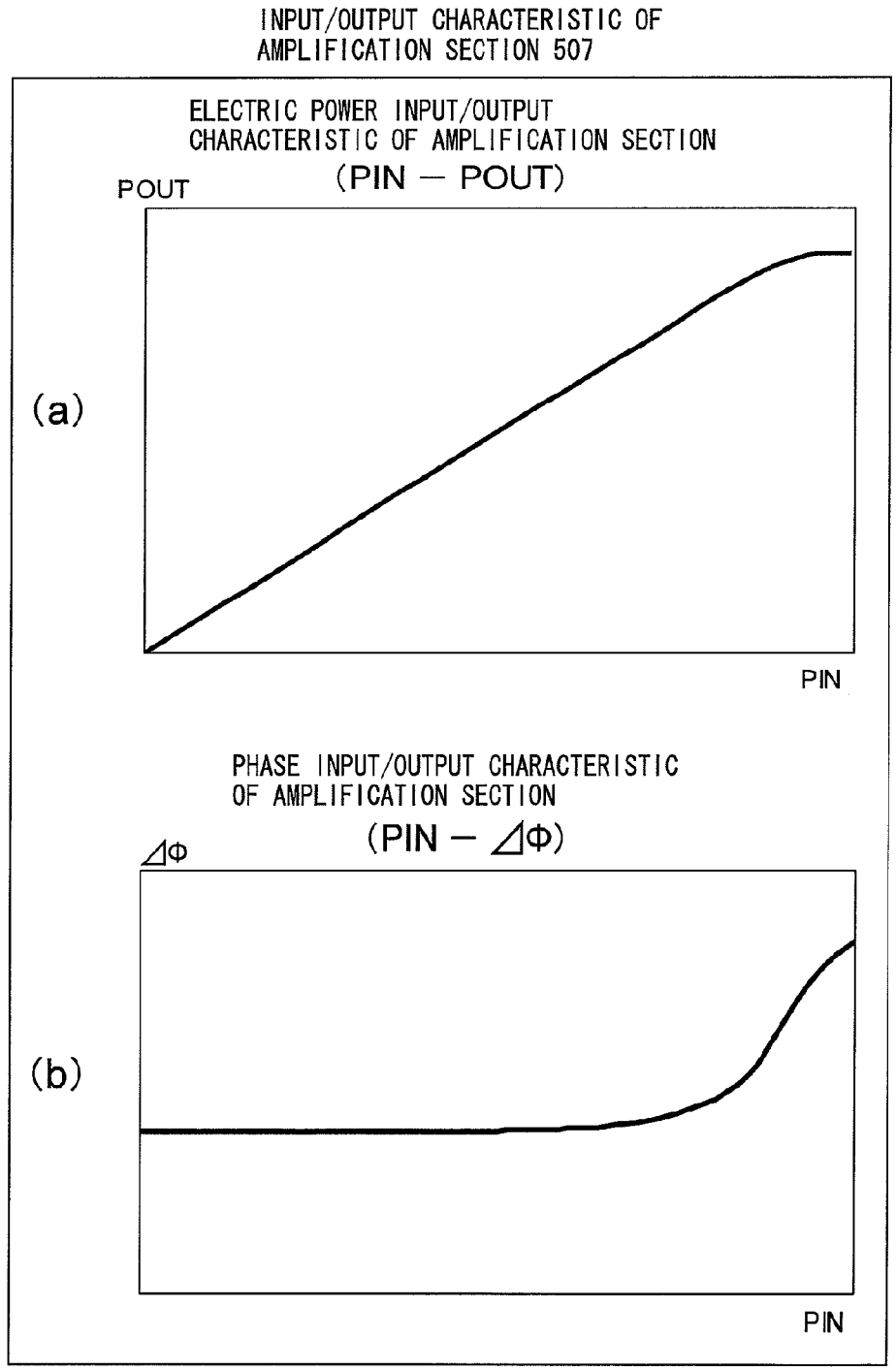
FIG. 15 shows the input/output characteristic of an amplification section 507 of the conventional radio transmission apparatus 500.
Figure 17:
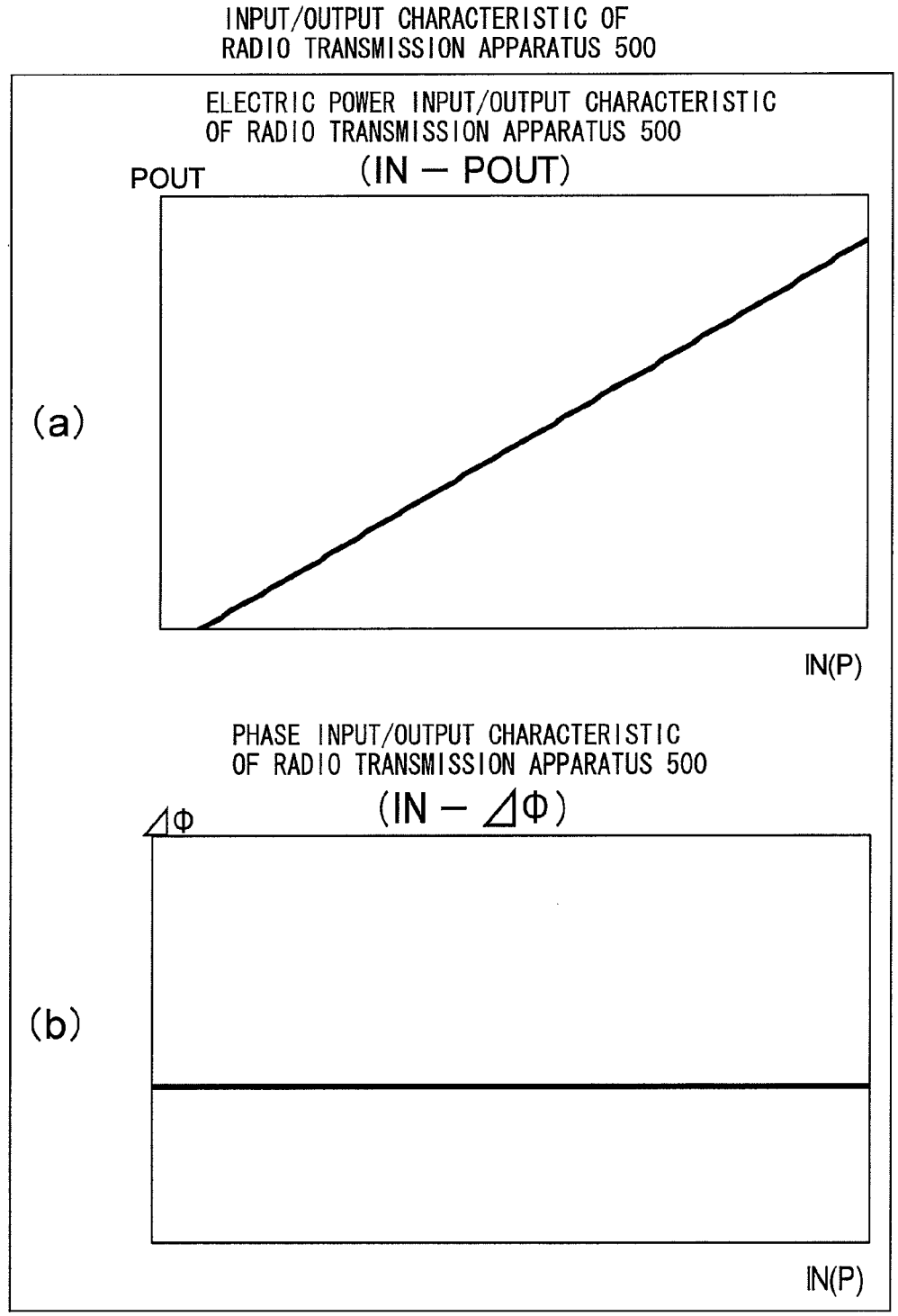
FIG. 17 shows the input/output characteristic of the radio transmission apparatus 500.
Figure 18:
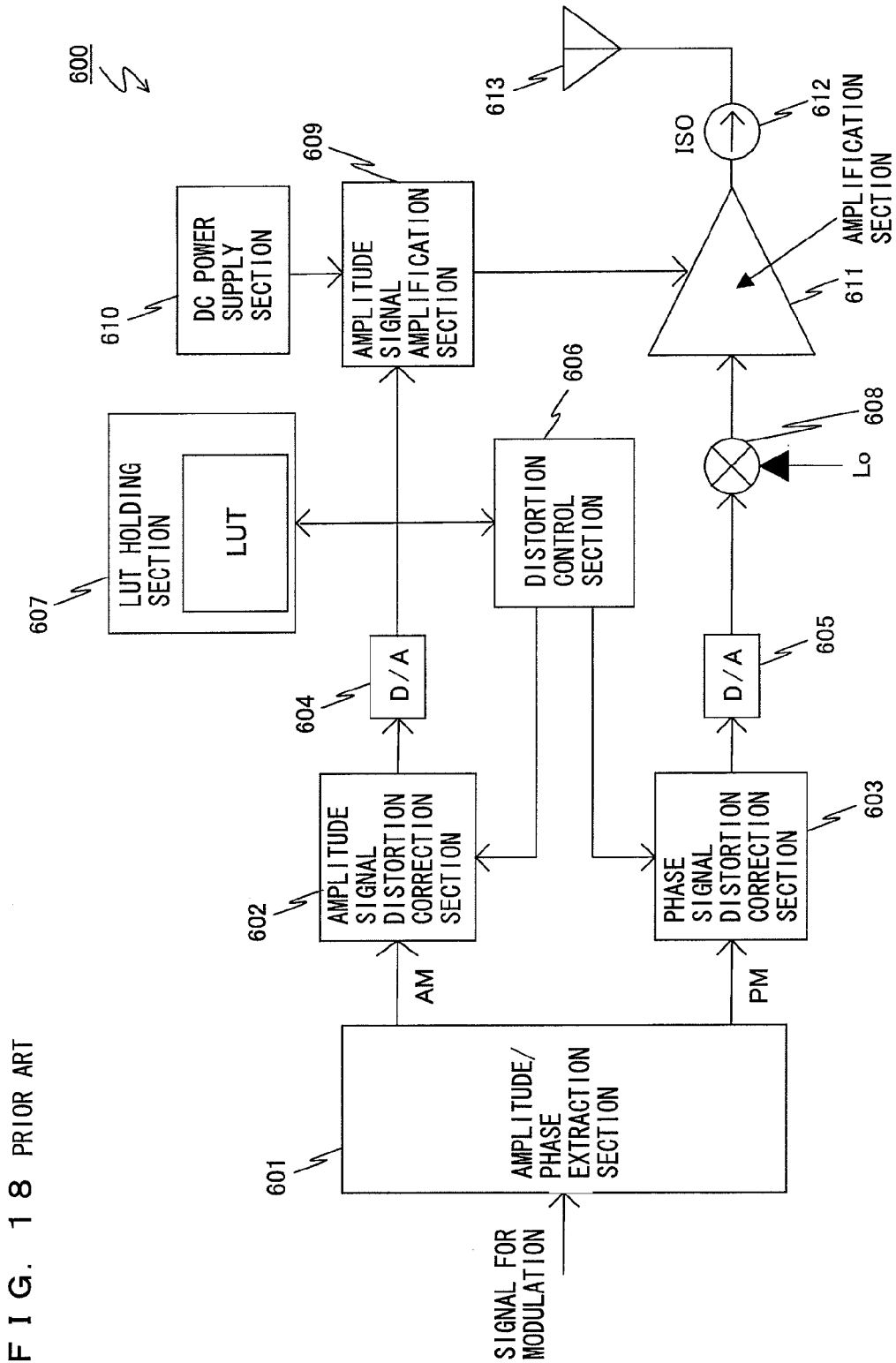
FIG. 18 shows an example of a conventional radio transmission apparatus 600 that modulates data using a polar modulation scheme and transmits the modulated data.
Figure 19:
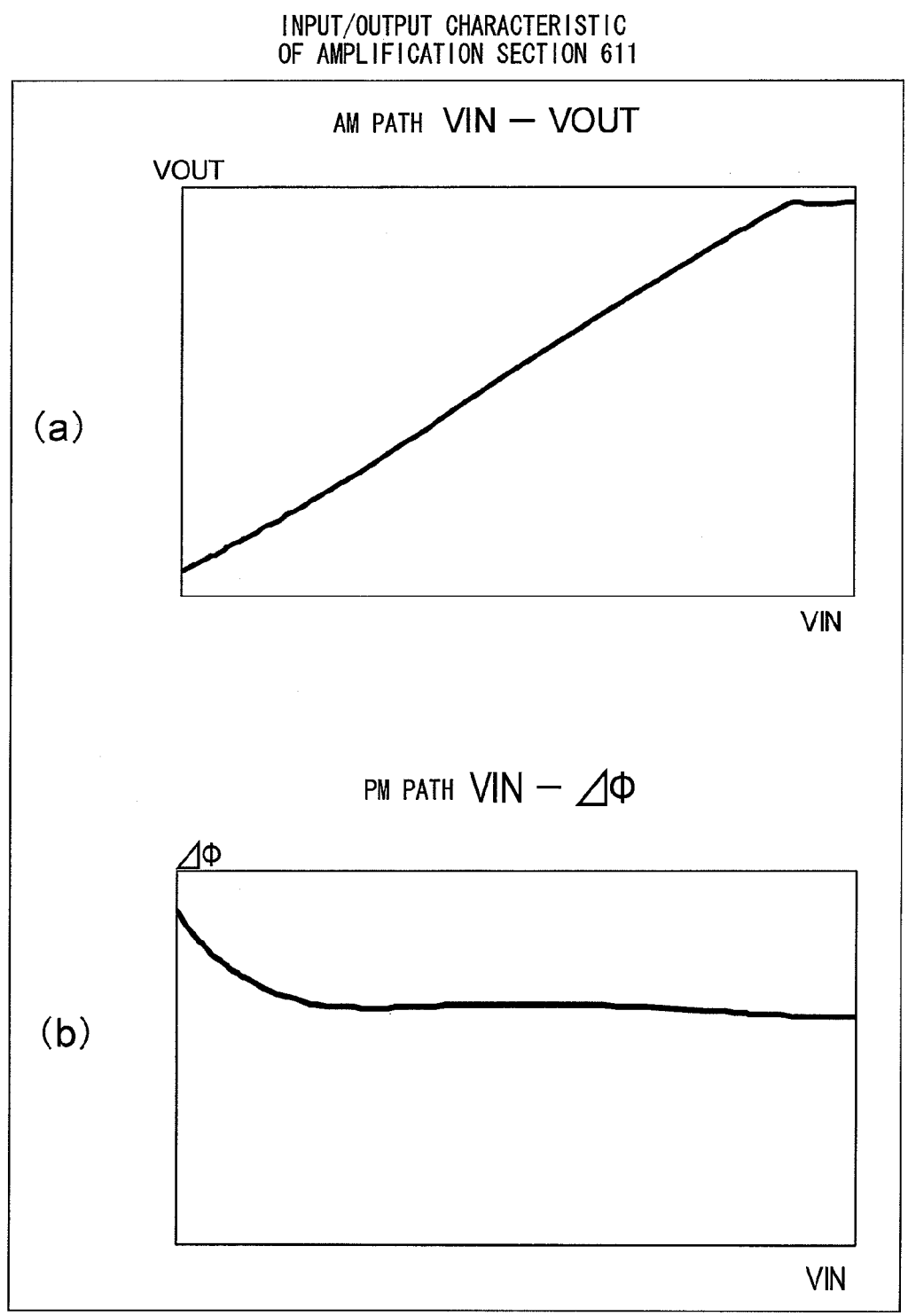
FIG. 19 shows the input/output characteristic of an amplification section 611 of the conventional radio transmission apparatus 600.

Further, the radio transmission apparatus 100 according to the aforementioned first embodiment and the radio transmission apparatus 200 according to the aforementioned second embodiment are typically applied to mobile phones. FIG. 13 shows a mobile phone including the radio transmission apparatus 100 according to the aforementioned first embodiment or the radio transmission apparatus 200 according to the aforementioned second embodiment.

While the invention has been described in detail, the foregoing description is in all aspects illustrative and not restrictive. It is understood that numerous other modifications and variations can be devised without departing from the scope of the invention.

What is claimed is:

1. A radio transmission apparatus for transmitting a transmission signal by radio, the radio transmission apparatus comprising:
    an amplification section that generates a transmission signal by a signal amplification process;
    a power supply section that supplies an electric power to the amplification section;
    an antenna that transmits the transmission signal generated by the amplification section;
    a current detection section that detects an output current of the power supply section that varies in response to a variation of an output impedance of the amplification section;
    an LUT holding section that holds: a standard table that corrects a distortion of an input/output characteristic of the amplification section that is obtained when the output current of the power supply section is within a predetermined range; and a correction table that corrects a distortion of the input/output characteristic of the amplification section that is obtained when the output current of the power supply section is greater than the predetermined range;
    a distortion correction section that adjusts a signal inputted to the amplification section, based on the standard table or the correction table to correct a distortion of the input/output characteristic of the amplification section; and
    a distortion control section that instructs the distortion correction section: to use the standard table until the output current of the power supply section exceeds a first threshold that is an upper limit of the predetermined range; to use the correction table from the time when the output current of the power supply section exceeds the first threshold to the time when the output current of the power supply section becomes less than a second threshold that is less than the first threshold; and to use the standard table from the time when the output current of the power supply section becomes less than the second threshold to the time when the output current of the power supply section exceeds the first threshold again.

2. The radio transmission apparatus according to claim 1, wherein the amplification section amplifies a quadrature modulated signal to generate the transmission signal.

3. The radio transmission apparatus according to claim 1, further comprising an amplitude signal amplification section that amplifies an amplitude signal by using the electric power of the power supply section, wherein the amplification section amplifies a phase signal by using the amplitude signal amplified by the amplitude signal amplification section, to generate the transmission signal, and the distortion correction section includes:

an amplitude signal distortion correction section that adjusts the amplitude signal inputted to the amplitude signal amplification section, based on the standard table or the correction table to correct an amplitude distortion of the input/output characteristic of the amplification section; and a phase signal distortion correction section that adjusts the phase signal inputted to the amplification section, based on the standard table or the correction table to correct a phase distortion of the input/output characteristic of the amplification section.

4. The radio transmission apparatus according to claim 1, wherein the distortion control section instructs the distortion correction section: to use the standard table until the output current of the power supply section continuously exceeds the first threshold for a predetermined period; to use the correction table from the time when the output current of the power supply section continuously exceeds the first threshold for the predetermined period to the time when the output current of the power supply section continuously falls below the second threshold for the predetermined period; and to use the standard table from the time when the output current of the power supply section continuously falls below the second threshold for the predetermined period to the time when the output current of the power supply section continuously exceeds the first threshold for the predetermined period again.

5. A mobile phone comprising a radio transmission apparatus according to claim 1.

6. A radio transmission method for transmitting a transmission signal by radio, the radio transmission method comprising:

an amplification step of generating a transmission signal by an amplification section to which an electric power is supplied from a power supply section;

a transmission step of transmitting the transmission signal generated at the amplification step;

a current detection step of detecting an output current of the power supply section that varies in response to a variation of an output impedance of the amplification section; and a distortion correction step of adjusting a signal inputted to the amplification section, based on: a standard table that corrects a distortion of an input/output characteristic of the amplification section that is obtained when the output current of the power supply section is within a predetermined range; or a correction table that corrects a distortion of the input/output characteristic of the amplification section that is obtained when the output current of the power supply section is greater than the predetermined range, to correct a distortion of the input/output characteristic of the amplification section, wherein at the distortion correction step, the standard table is used until the output current of the power supply section exceeds a first threshold that is an upper limit of the predetermined range;

the correction table is used from the time when the output current of the power supply section exceeds the first threshold to the time when the output current of the power supply section becomes less than a second threshold that is less than the first threshold; and the standard table is used from the time when the output current of the power supply section becomes less than the second threshold to the time when the output current of the power supply section exceeds the first threshold again.

* * * * *